(12) United States Patent
Masuoka et al.

(10) Patent No.: US 8,373,235 B2
(45) Date of Patent: Feb. 12, 2013

(54) SEMICONDUCTOR MEMORY DEVICE AND PRODUCTION METHOD THEREFOR

(75) Inventors: Fujio Masuoka, Tokyo (JP); Shintaro Arai, Tokyo (JP)

(73) Assignee: Unisantis Electronics Singapore Pte Ltd., Peninsula Plaza (SG)

(*) Notice: Subject to any disclaimer, the term of this patent is extended or adjusted under 35 U.S.C. 154(b) by 511 days.

(21) Appl. No.: 12/784,826

(22) Filed: May 21, 2010

(65) Prior Publication Data
US 2010/0295135 A1 Nov. 25, 2010

Related U.S. Application Data

(60) Provisional application No. 61/217,112, filed on May 27, 2009.

(30) Foreign Application Priority Data

May 22, 2009 (JP) .................................. 2009-123882

(51) Int. Cl.
*H01L 27/088* (2006.01)
(52) U.S. Cl. .................... 257/368; 257/E27.098
(58) Field of Classification Search .......... 257/368–369, 257/328–329, 337–338, E27.098, E29.255
See application file for complete search history.

(56) References Cited

U.S. PATENT DOCUMENTS

| 4,670,768 A | 6/1987 | Sunami et al. |
| 5,293,053 A | 3/1994 | Malhi et al. |
| 5,818,080 A * | 10/1998 | Kuriyama ...................... 257/315 |
| 6,127,209 A | 10/2000 | Maeda et al. |
| 2001/0053089 A1 | 12/2001 | Noble |
| 2004/0113207 A1 * | 6/2004 | Hsu et al. ...................... 257/368 |
| 2004/0135215 A1 * | 7/2004 | Song ............................. 257/379 |
| 2007/0007601 A1 * | 1/2007 | Hsu et al. ...................... 257/368 |

FOREIGN PATENT DOCUMENTS

GB 2371921 A 8/2002
(Continued)

OTHER PUBLICATIONS

Communication pursuant to Article 94(3) EPC, the Examination for European Patent Application No. 10 005 356.0-2203 dated Jul. 27, 2011.
(Continued)

*Primary Examiner* — Matthew W Such
*Assistant Examiner* — Ali Naraghi
(74) *Attorney, Agent, or Firm* — Brinks Hofer Gilson & Lione

(57) ABSTRACT

In a static memory cell comprising six MOS transistors, the MOS transistors have a structure in which the drain, gate and source formed on the substrate are arranged in the vertical direction and the gate surrounds the columnar semiconductor layer, the substrate comprises a first active region having a first conductive type and a second active region having a second conductive type, and diffusion layers constructing the active regions are mutually connected via a silicide layer formed on the substrate surface, thereby realizing an SRAM cell with small surface area. In addition, drain diffusion layers having the same conductive type as a first well positioned on the substrate are surrounded by a first anti-leak diffusion layer and a second anti-leak diffusion layer having a conductive type different from the first well and being shallower than the first well, and thereby controlling leakage to the substrate.

18 Claims, 47 Drawing Sheets

FOREIGN PATENT DOCUMENTS

| | | |
|---|---|---|
| JP | 2-188966 A | 7/1990 |
| JP | 3-225873 A | 10/1991 |
| JP | 06-021467 A | 1/1994 |
| JP | 7-99311 A | 4/1995 |
| JP | 10-79482 A | 3/1998 |
| JP | 2000-243858 A | 9/2000 |
| JP | 2005-78741 A | 3/2005 |
| JP | 2008-205168 A | 9/2008 |
| KR | 2004-0063348 A | 7/2004 |
| KR | 20050066729 A | 6/2005 |
| WO | 2009/060934 A1 | 5/2009 |

OTHER PUBLICATIONS

Korean Office Action for Korean Patent Application No. KR 2010-79574 dated Jul. 28, 2011 with English Translation.
Korean Office Action for Korean Patent Application No. 2010-47888 mailing date of Jun. 20, 2011 with English Translation.
European Search Report for Application No./Patent No. 10005356.0-2203/2254149 dated Dec. 2, 2010.
English translation of Japanese Application No. 10-79482, published Mar. 24, 1998 (seperated into 2 parts).

* cited by examiner

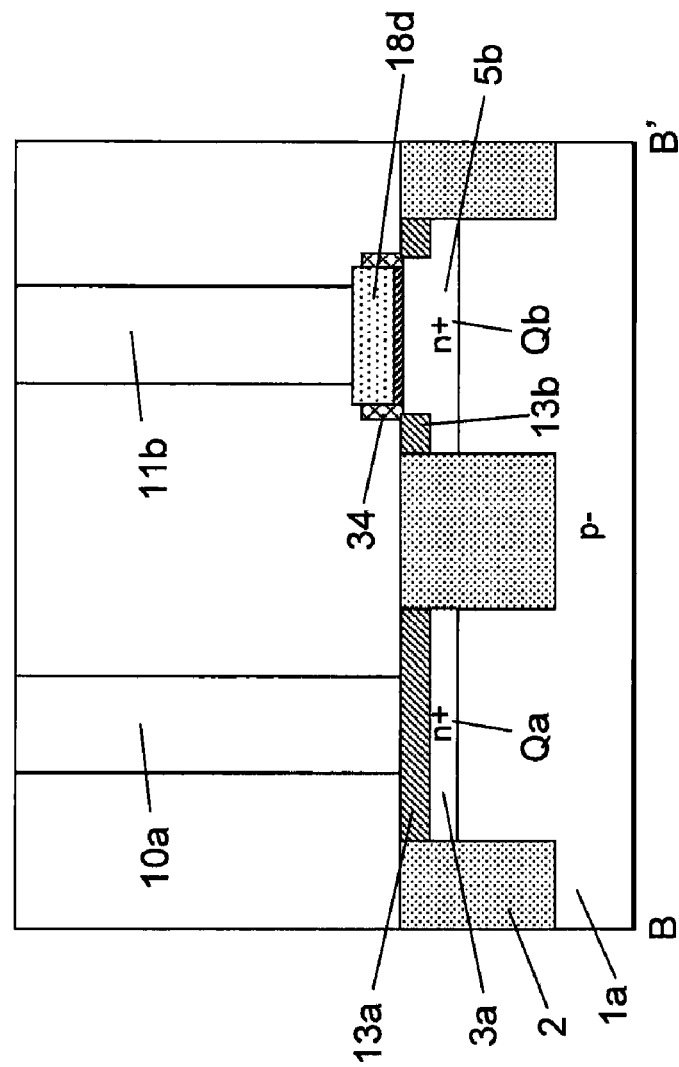

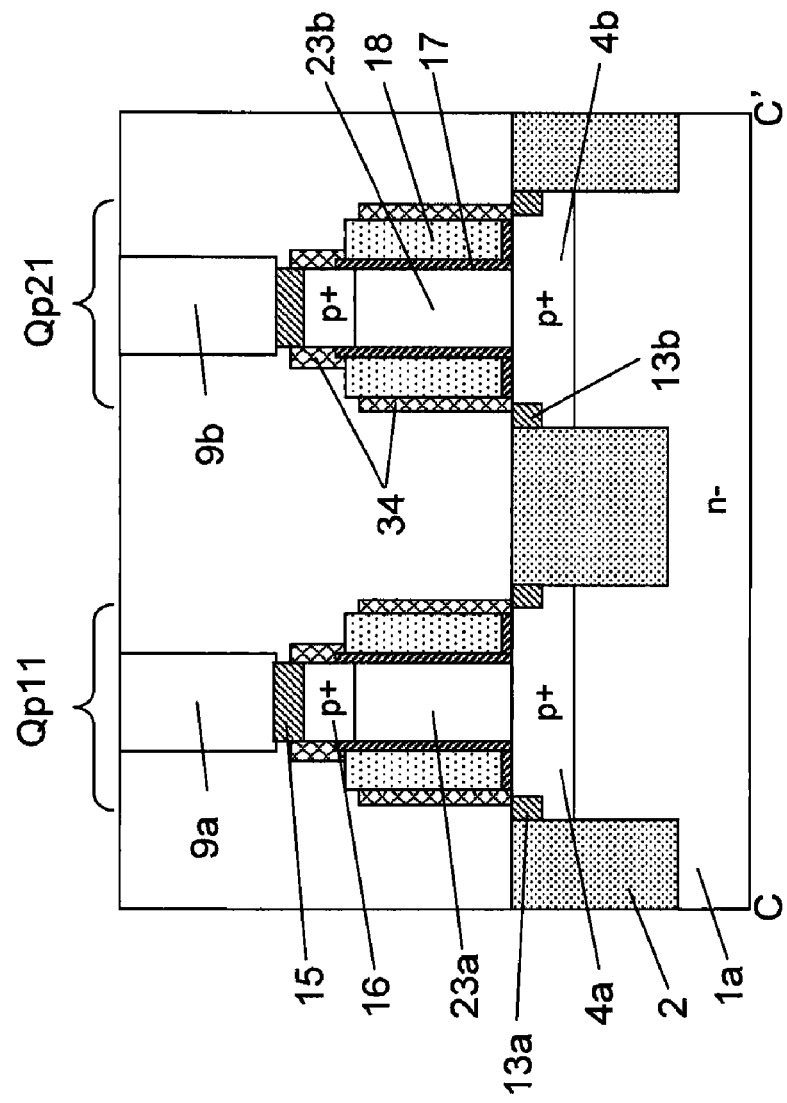

Prior Art

SEMICONDUCTOR MEMORY DEVICE AND PRODUCTION METHOD THEREFOR

CROSS-REFERENCE TO RELATED APPLICATION

This application claims the benefit of Japanese Patent Application No. 2009-123882 filed on May 22, 2009 and U.S. Provisional Application No. 61/217,112 filed on May 27, 2009, the entire disclosure of which is incorporated by reference herein.

FIELD

The present application relates to a semiconductor memory device, and more particularly to a semiconductor memory device composed of Static Random Access Memory ("SRAM").

BACKGROUND

In order to attain greater integration and higher performance in semiconductor devices, a Surrounding Gate Transistor ("SGT") that is a vertical gate transistor is disclosed, having a columnar semiconductor formed on the surface of a semiconductor substrate and a gate formed on the side wall thereof so as to surround the columnar semiconductor layer (for example, see Unexamined Japanese Patent Application KOKAI Publication No. H2-188966). In an SGT, the drain, gate and source are arranged in a vertical direction making it possible to greatly reduce the occupied surface area in comparison to traditional planar transistors.

When a large-scale integrated circuit ("LSI") is created using SGTs, it is indispensable to use SRAM composed in combination with the SGTs as the cache memory thereof. In recent years, there has been extremely strong demand to increase the capacity of SRAM mounted on LSI, so it is essential that SRAM having a small cell surface area be attained even when using SGTs.

FIG. 25A shows an illustrative planar view of a CMOS-type 6T-SRAM containing six transistors designed using SGTs, as exhibited in the embodiment of Unexamined Japanese Patent Application KOKAI Publication No. 117-99311, and FIG. 25B shows a cross-sectional view thereof. The aforementioned SRAM will be described with reference to these drawings. Bit wires 801a and 801b are formed of an N+ diffusion layer, ground potential wiring GND is formed of an N+ diffusion layer 802 and power source potential wiring Vcc is formed of a P+ diffusion layer 803. On top of these diffusion layers, columnar silicon layers are formed constructing access transistors 810a and 810b in order to access memory cells, driver transistors 811a and 811b in order to drive the memory cells, and load transistors 812a and 812b in order to supply electrical charge to the memory cells. Gates 804a, 804b, 804c and 804d are formed to surround these columnar silicon layers. Memory nodes comprise wiring layers 807a and 807b. In the above-described SRAM cell, the various transistors constructing the SRAM have the source, gate and drain formed in a vertical direction on the columnar silicon layers, so it is possible to design small SRAM cells.

SUMMARY

However, the above-described SRAM cell has the following problems.

In the SRAM of Unexamined Japanese Patent Application KOKAI Publication No. H7-99311, when the power source potential wiring 803 and the ground potential wiring 802 formed inside the SRAM cell array are formed with the minimum dimensions, it is possible to attain a small cell surface area. However, the above-described power source potential wiring 803 and ground potential wiring 802 are formed of a P+ diffusion layer and an N+ diffusion layer, respectively. Therefore, when these are formed with the minimum dimensions, the SRAM has an extremely high resistance, making stable operation of the SRAM impossible. Conversely, when the dimensions of the power source potential wiring 803 and the ground potential wiring 802 are enlarged in order to attain stable operation of the SRAM, the SRAM cell surface area increases.

In consideration of the foregoing, and it is an object of the present application to attain an SRAM cell with small surface area in a CMOS-type 6T-SRAM using SGTs, and to attain an SRAM cell having sufficient operating margin.

In order to achieve the above purpose, the semiconductor memory device of the present application is a semiconductor memory device comprising multiple static memory cells in each of which a plurality of, approximately six, MOS transistors are arranged on a substrate, wherein each of the six MOS transistors comprises a lower diffusion layer formed on a surface of the substrate, a columnar semiconductor layer formed on the lower diffusion layer, an upper diffusion layer formed on the columnar semiconductor layer, a gate insulating film formed on the side wall of the columnar semiconductor layer to surround the columnar semiconductor layer, and a gate electrode formed on the gate insulating film to surround the gate insulating film;

wherein the lower diffusion layer, columnar semiconductor layer, and upper diffusion layer are arranged on the substrate in layers in the vertical direction, one of the lower and upper diffusion layers serving as a source diffusion layer and the other serving as a drain diffusion layer;

wherein the six MOS transistors serve as first and second NMOS access transistors for accessing the memory, first and second NMOS driver transistors for driving a memory node in order to retain data in the memory cells, and first and second PMOS load transistors for supplying electric charge in order to retain data in the memory cells, respectively, the first NMOS access transistor, the first NMOS driver transistor, and the first PMOS load transistor being arranged mutually adjacent, and the second NMOS access transistor, the second NMOS driver transistor, and the second PMOS load transistor being arranged mutually adjacent;

a first well shared by the multiple memory cells for giving a potential to the substrate formed in a surface region of the substrate;

a first lower diffusion layer that is the lower diffusion layer of the first NMOS access transistor, a second lower diffusion layer that is the lower diffusion layer of the first NMOS driver transistor, and a third lower diffusion layer that is the lower diffusion layer of the first PMOS load transistor wherein the first lower diffusion layer, the second lower diffusion layer, and the third lower diffusion layer are mutually connected via a first silicide layer formed on the surfaces of the first lower diffusion layer, the second lower diffusion layer, and the third lower diffusion layer, allowing the first lower diffusion layer, the second lower diffusion layer, and the third lower diffusion layer which are mutually connected to serve as a first memory node for retaining data stored in the memory cells;

a first anti-leak diffusion layer having a conductive type different from the first well, the first anti-leak diffusion layer formed shallower than the first well is formed at the bottom of the lower diffusion layer having the same conductive type as the first well among the first, second, and third lower diffusion layers in order to prevent short to the first well wherein the first anti-leak diffusion layer is directly connected to the lower diffusion layer having the same conductive type as the first anti-leak diffusion layer among the first, second, and third lower diffusion layers;

a fourth lower diffusion layer that is the lower diffusion layer of the second NMOS access transistor, a fifth lower diffusion layer that is the lower diffusion layer of the second NMOS driver transistor, and a sixth lower diffusion layer that is the lower diffusion layer of the second PMOS load transistor wherein the fourth lower diffusion layer, the fifth lower diffusion layer, and the sixth lower diffusion layer are mutually connected via a second silicide layer formed on the surfaces of the fourth lower diffusion layer, the fifth lower diffusion layer, and the sixth lower diffusion layer, allowing the fourth lower diffusion layer, the fifth lower diffusion layer, and the sixth lower diffusion layer which are mutually connected to serve as a second memory node for retaining data stored in the memory cells; and a second anti-leak diffusion layer having a conductive type different from the first well and formed shallower than the first well, the second anti-leak diffusion layer formed at the bottom of the lower diffusion layer having the same conductive type as the first well among the fourth lower diffusion layer, the fifth lower diffusion layer, and the sixth lower diffusion layer in order to prevent short to the first well, the second anti-leak diffusion layer being directly connected to the lower diffusion layer having the same conductive type as the second anti-leak diffusion layer among the fourth, fifth, and sixth lower diffusion layers.

In a preferred configuration of the present application, the semiconductor memory device further comprises a first NMOS driver gate wiring extending from the first gate electrode of the first NMOS driver transistor and a first PMOS load gate wiring extending from the second gate electrode of the first PMOS load transistor which are connected by a common contacts, and a second NMOS driver gate wiring extending from the third gate electrode of the second NMOS driver transistor and a second PMOS load gate wiring extending from the fourth gate electrode of the second PMOS load transistor which are connected by a common contact.

In addition, in another preferred configuration, the circumference of the side wall of the columnar semiconductor layer constructing the first NMOS driver transistor has a value equal to or greater than the circumference of the side wall of the columnar semiconductor layer constructing the first NMOS access transistor, and the circumference of the side wall of the columnar semiconductor layer constructing the second NMOS driver transistor has a value equal to or greater than the circumference of the side wall of the columnar semiconductor layer constructing the second NMOS access transistor; or the circumference of the side wall of the columnar semiconductor layer constructing the first PMOS load transistor has a value equal to or less than the circumference of the side wall of the columnar semiconductor layer constructing the first NMOS access transistor. Alternatively, the circumference of the side wall of the columnar semiconductor layer constructing the second PMOS load transistor has a value equal to or less than the circumference of the side wall of the columnar semiconductor layer constructing the second NMOS access transistor.

In another preferred configuration of the present application, at least one of the contact formed on the first NMOS access gate wiring extending from the fifth gate electrode of the first NMOS access transistor and the contact formed on the second NMOS access gate wiring extending from the sixth gate electrode of the second NMOS access transistor is shared with the contact formed on the adjacent gate wiring extending from the gate electrode of the first or second NMOS access transistor of the adjacent memory cell.

In addition, in another preferred configuration of the present application, the columnar semiconductor layers constructing the MOS transistors are arranged in a hexagonal lattice shape.

In addition, in another preferred configuration of the present application, the first NMOS driver gate wiring extending from the first gate electrode of the first NMOS driver transistor and the first PMOS load gate wiring extending from the second gate electrode of the first PMOS load transistor are connected by a common contact with the lower diffusion layers serving as the second memory node; and the second NMOS driver gate wiring extending from the third gate electrode of the second NMOS driver transistor and the second PMOS load gate wiring extending from the fourth gate electrode of the second PMOS load transistor are connected by a common contact with the lower diffusion layers serving as the first memory node.

In an preferred configuration of the present application,
the six MOS transistors are arranged on the substrate in three rows and two columns;
the first NMOS access transistor is arranged in row 1, column 1;
the first PMOS load transistor is arranged in row 2, column 1;
the first NMOS driver transistor is arranged in row 3, column 1;
the second NMOS access transistor is arranged in row 3, column 2;
the second PMOS load transistor is arranged in row 2, column 2; and
the second NMOS driver transistor is arranged in row 1, column 2.

In addition, in another preferred configuration of the present application,
the six MOS transistors are arranged on the substrate in three rows and two columns;
the first NMOS access transistor is arranged in row 1, column 1;
the first PMOS load transistor is arranged in row 3, column 1;
the first NMOS driver transistor is arranged in row 2, column 1;
the second NMOS access transistor is arranged in row 3, column 2;
the second PMOS load transistor is arranged in row 1, column 2; and
the second NMOS driver transistor is arranged in row 2, column 2.

In addition, in another preferred configuration of the present application,
the six MOS transistors are arranged on the substrate in three rows and two columns;
the first NMOS access transistor is arranged in row 1, column 1;
the first PMOS load transistor is arranged in row 3, column 1;
the first NMOS driver transistor is arranged in row 2, column 1;
the second NMOS access transistor is arranged in row 1, column 2;
the second PMOS load transistor is arranged in row 3, column 2; and the second NMOS driver transistor is arranged in row 2, column 2.

Preferably, the contacts formed on the gate wirings extending from the gate electrodes of the first and second NMOS access transistors are shared.

In addition, in another preferred configuration of the present application, the six MOS transistors are arranged on the substrate in two rows and three columns;

the first NMOS access transistor is arranged in row 1, column 1;

the first PMOS load transistor is arranged in row 2, column 2;

the first NMOS driver transistor is arranged in row 2, column 1;

the second NMOS access transistor is arranged in row 2, column 3;

the second PMOS load transistor is arranged in row 1, column 2; and the second NMOS driver transistor is arranged in row 1, column 3.

In addition, in another preferred configuration of the present application, the contacts formed on the columnar semiconductor and the other contacts in the semiconductor device are formed through different lithographic or etching processes.

BRIEF DESCRIPTION OF THE DRAWINGS

FIG. 3B is a cross-sectional view of the SRAM according to the first embodiment of the present application.

FIG. 4C is a cross-sectional view of the SRAM according to the first embodiment of the present application.

DETAILED DESCRIPTION

The semiconductor device according to embodiments of the present application will be described hereafter with reference to FIGS. 1 to 24D. FIGS. 2, 5A, 6A, 7A, 8A, 9A, 10A, 11A, 12A, 13A, 14A, 15A, 16A, 17 to 23, and 25A are planar views in which some part is hatched for distinguishing regions.

Embodiment 1

Figure 1:
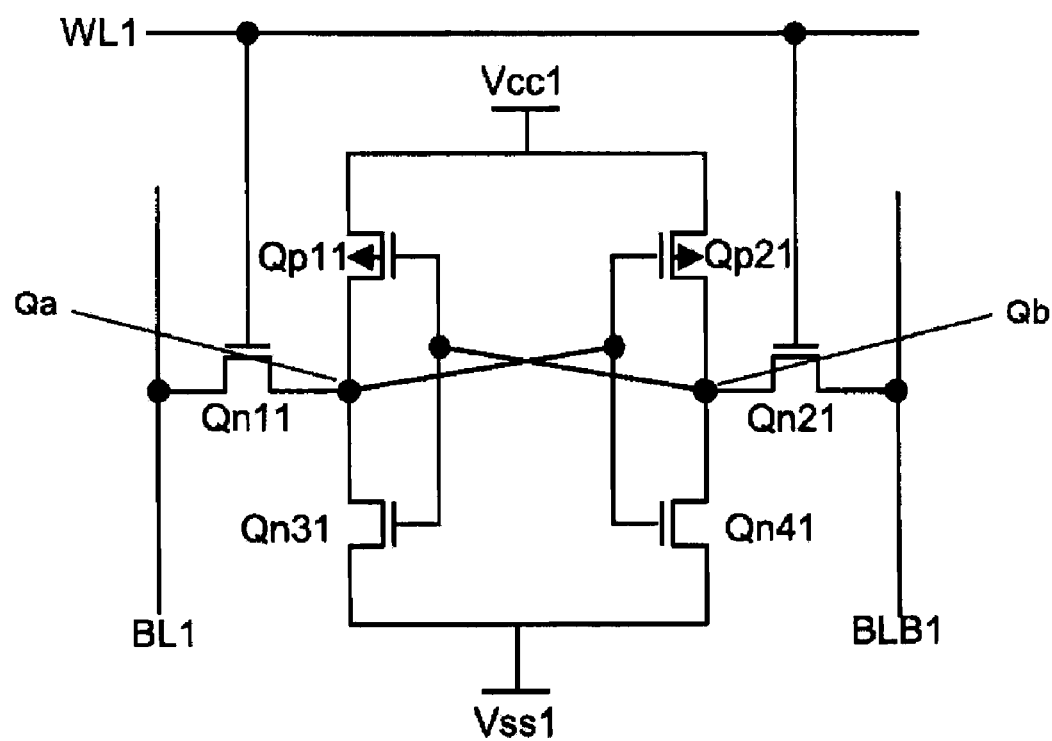
FIG. 1 is an equivalent circuit diagram showing the SRAM according to a first embodiment of the present application.

FIG. 1 shows an equivalent circuit of a CMOS-type 6T-SRAM memory cell of Embodiment 1 of the present application. In FIG. 1, reference numbers BL1 and BLB1 indicate bit lines, a reference number WL1 indicates a word line, a reference number Vcc1 indicates a power source potential wire, a reference number Vss1 indicates a ground potential wire, reference numbers Qn11 and Qn21 indicate access transistors for accessing the memory cell, reference numbers Qn31 and Qn41 indicate driver transistors for driving the memory cell, reference numbers Qp11 and Qp21 indicate load transistors for supplying electric charge to the memory cell and reference numbers Qa and Qb indicate memory nodes for storing data.

Below, the read operation in which data "L" is stored in the memory node Qa and data "H" is stored in the memory node Qb is described as an example of the operation of the memory cell in FIG. 1. First, the bit lines BL1 and BLB1 are precharged to an "H" electric potential in the read-out operation. After precharging to these lines is completed, the word line WL1 goes to "H" and then, the readout of the data is initiated. At this time, the access transistors Qn11 and Qn21 turn on, and the driver transistor Qn31 turns on because the memory node Qb has a potential value close to the "H" electric potential. Then, the electric potential of the bit line BL1 which is at "H" is discharged from the access transistor Qn11 via the memory node Qa and the driver transistors Qn31 and the electric potential of the bit line BL1 approaches an "L" electric potential. On the other hand, the driver transistor Qn41 is off because the memory node Qa has a potential value close to the "L" electric potential. Therefore, the electric potential of the bit line BLB1 is not discharged and conversely supplied from the load transistors Qp21, so the potential of the bit line BLB1 remains close to the "H" electric potential. When the difference in electric potential between the bit lines BL1 and BLB1 reaches a level that can be amplified by a sense amp, an unrepresented sense amp connected to the bit lines starts up, and the memory cell data is amplified and output.

Figure 2:
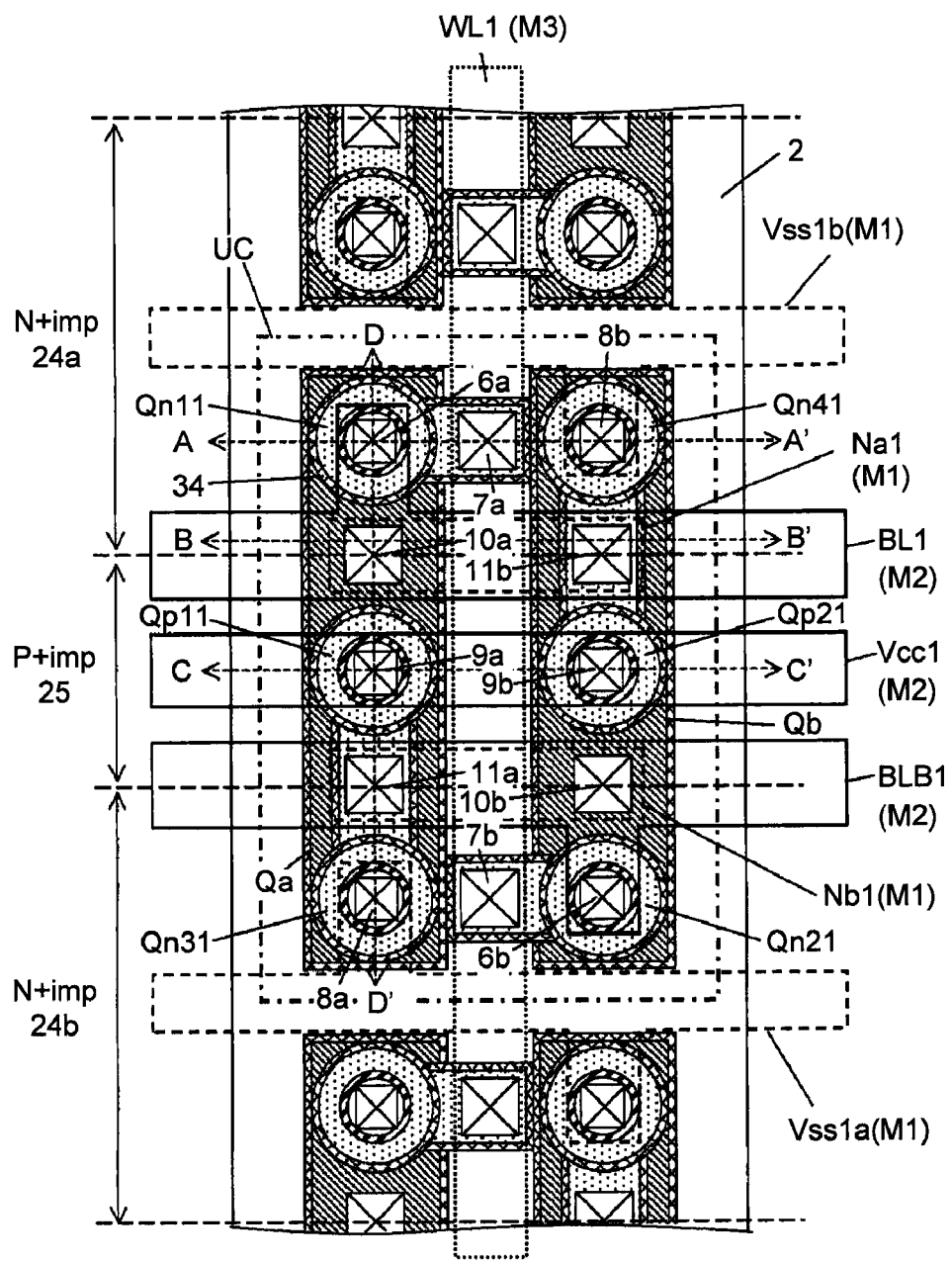
FIG. 2 is a planar view of the SRAM according to the first embodiment of the present application.

FIG. 2 shows a layout diagram for an SRAM memory cell of the first embodiment of the present application. The unit cell UC shown in FIG. 2 is repeatedly positioned in the SRAM cell array. FIGS. 3A, 3B, 3C and 3D show the cross-sectional structure along lines A-A', B-B', C-C' and D-D', respectively, in the layout diagram of FIG. 2.

The layout of this embodiment will be described first with reference to FIGS. 2 and 3A to 3D.

In the SRAM cell array on the substrate, a P-well, which is a first well 1a, is formed and the lower diffusion layer on the surface of the substrate is separated by an isolation layer 2. The first memory node Qa comprising the lower diffusion layers in the surface region of the substrate is composed of a first N+ lower diffusion layer 3a, a second N+ lower diffusion layer 5a, and a third P+ lower diffusion layer 4a (also simply termed the lower diffusion layers, hereafter). The mutually adjacent N+ lower diffusion layers and P+ lower diffusion layer are connected by a silicide layer 13a formed on the substrate surface. A second memory node Qb comprising the lower diffusion layers in the surface region of the substrate is composed of a fourth N+ lower diffusion layer 3b, a fifth N+ lower diffusion layer 5b, and a sixth P+ lower diffusion layer 4b formed on the bottom of the access transistor Qn21 (also simply termed the lower diffusion layers, hereafter). And, the mutually adjacent N+ lower diffusion layers and P+ lower diffusion layer are connected by a silicide layer 13b formed on the surface of each of the diffusion layers. First and second anti-leak N+ diffusion layers 1b, 1c are formed at the bottoms of the P+ lower diffusion layers, which have the same conductive type as the P-well that is the first well 1a, in order to control leakage to the substrate. The first and second anti-leak N+ diffusion layers 1b, 1c are each separated by an isolation layer 2.

Access transistors Qn11 and Qn21 are formed of NMOS and they are access transistors for accessing a memory cell. Driver transistors Qn31 and Qn41 are NMOS and they are driver transistors for driving memory cells. Load transistors Qp11 and Qp21 are PMOS and they are load transistors for supplying electric charge to memory cells.

In this embodiment, the single unit cell UC is provided with transistors arranged in three rows and two columns on the substrate. In the first column, the access transistor Qn11, the load transistor Qp11 and the driver transistor Qn31 are arranged in order from the top of the diagram. The diffusion layers 3a, 4a and 5a arranged in the lower layers of transistors Qn11, Qp11 and Qn31 serve as the first memory node Qa. In addition, in the second column the driver transistor Qn41, the load transistor Qp21 and the access transistor Qn21 are arranged in order from the top of the diagram. The lower diffusion layers 3b, 4b and 5b arranged in the lower layer of transistors Qn41, Qp21 and Qn21 serve as the second memory node Qb. The SRAM cell array according to this embodiment preferably contains unit cells UC, which are respectively provided with these six transistors, arranged continuously in the up and down direction in the drawing.

A contact 10a formed on the lower diffusion layers on the substrate that are the first memory node Qa is connected to a contact 11b formed on the gate wiring extending from the gate electrodes of the load transistor Qp21 and the driver transistors Qn41 through node connection wiring Na1. Furthermore, a contact 10b formed on the lower diffusion layers on the substrate that are the second memory node Qb is connected to a contact 11a formed on the gate wiring extending from the gate electrodes of the load transistor Qp11 and the driver transistor Qn31 through node connection wiring Nb1. A contact 6a formed on top of the access transistor Qn11 is connected to the bit line BL1, and a contact 6b formed on top of the access transistor Qn21 is connected to the bit line BLB1. A contact 7a formed on gate wiring extending from the gate electrode of the access transistor Qn11 and a contact 7b formed on gate wiring extending from the gate electrode of the access transistor Qn21 are connected to the word line WL1. Contacts 8a, 8b formed on top of the driver transistors Qn31, Qn41 are respectively connected to wiring layers Vss1a, Vss1b that are at ground potentials, and contacts 9a, 9b formed on top of the load transistors Qp11, Qp21 are connected to the wiring Vcc1 that is at the power source potential.

The wiring of the word lines, the wiring of the bit lines, the power source potential wiring and the ground potential wiring are preferably connected in a layer above the node connection wiring that is the wiring within each memory cell in order to be common with the wirings of other memory cells.

As one example of the configuration of the layered wiring described above, it is possible to attain an arrangement in which the node connection wiring Na1, Nb1 and the ground potential wiring Vss1a, Vss1b are wired in a layer below the bit lines BL1, BLB1 and below the power source potential wiring Vcc1, in which the word line WL1 is wired in a layer above the bit lines BL1, BLB1 and the power source potential wiring Vcc1.

FIG. 2 shows N+ doping regions 24a, 24b and a P+ doping region 25. In the SRAM cell array region according to this embodiment, the pattern forming the N+ doping regions 24a, 24b and the P+ doping region 25 is formed of simple lines and spaces. Therefore, discrepancies in dimension or positioning have little effect, and it is possible to minimize the margin of dimensions near the boundaries of the N+ doping regions and the P+ doping region. As described in terms of the drawing, this arrangement is effective at reducing the length of the SRAM cell in the vertical direction (the length in the direction of connecting each SRAM cell).

In addition, the memory nodes and gate wiring shown in the layout of FIG. 2 are formed in only a rectangular shape in this embodiment. Therefore, it is easy to correct the pattern shape through OPC (Optical Proximity Correction), and this layout is suitable for realizing a small SRAM cell surface area.

In this embodiment, the source and drain of each transistor constructing the SRAM are defined as follows. For the driver transistors Qn31, Qn41, the upper diffusion layer formed on top of the columnar semiconductor layer connected to the ground voltage is defined as the source diffusion layer, and the lower diffusion layer formed below the columnar semiconductor layer is defined as the drain diffusion layer. For the load transistors Qp11, Qp21, the upper diffusion layer formed on top of the columnar semiconductor layer connected to the power source voltage is defined as the source diffusion layer, and the lower diffusion layer formed below the columnar semiconductor layer is defined as the drain diffusion layer. For the access transistors, the upper diffusion layer formed on top of the columnar semiconductor layer and the lower diffusion layer formed below the columnar semiconductor layer are both source or drain depending on the operating state, but for convenience the upper diffusion layer formed on top of the columnar semiconductor layer is defined as the source diffusion layer and the lower diffusion layer formed below the columnar semiconductor layer is defined as the drain diffusion layer.

Figure 3A:
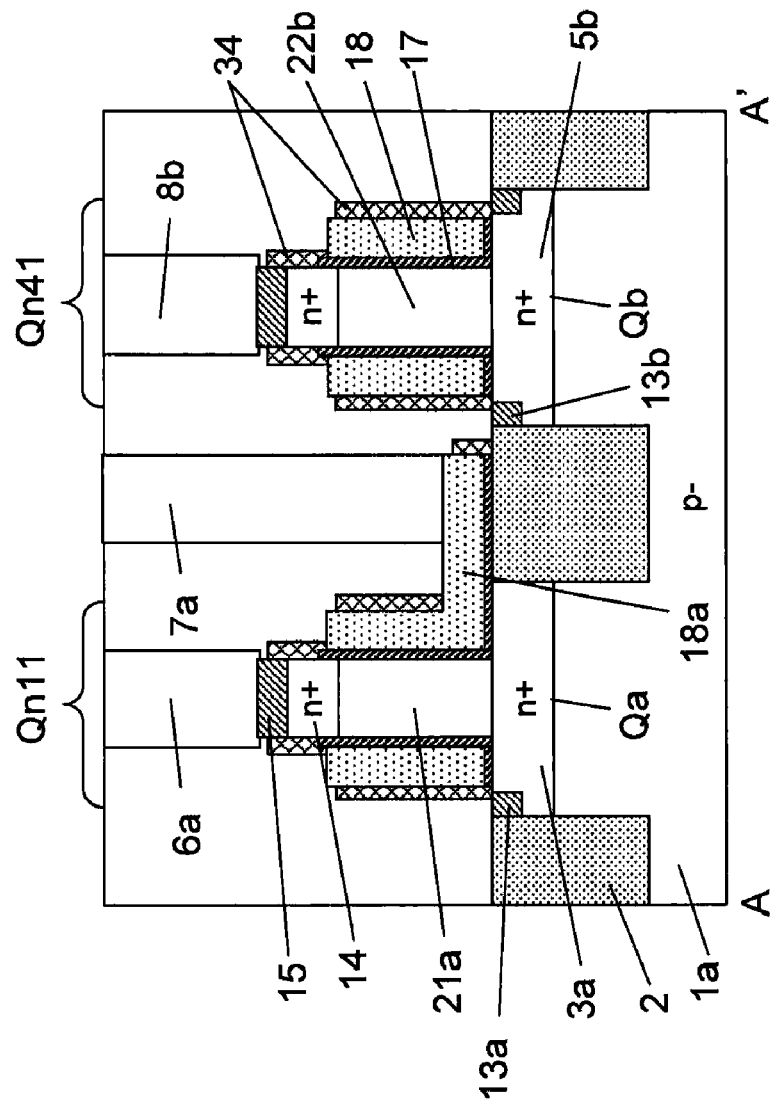
FIG. 3A is a cross-sectional view of the SRAM according to the first embodiment of the present application.

Next, the structure of the SRAM of this embodiment will be described with reference to the cross-sectional structure in FIGS. 3A to 3D. As shown in FIG. 3A, a P-well that is the first well 1a is formed in the surface region of the substrate and the lower diffusion layers in the surface region of the substrate are separated by the isolation layer 2. An N+ drain diffusion layer 3a is formed through conventional doping methods or the like in the first memory node Qa comprising the lower diffusion layers on the substrate, and a fifth N+ drain diffusion layer 5b is formed through conventional doping methods or the like in the second memory node Qb comprising the lower diffusion layers on the substrate. In addition, silicide layers 13a, 13b are formed on the surface of the N+ drain diffusion layers 3a, 5b. A columnar silicon layer 21a constructing the access transistor Qn11 is formed on top of the N+ drain diffusion layer 3a, and a columnar silicon layer 22b constructing the driver transistor Qn41 is formed on the N+ drain diffusion layer 5b. A gate insulating film 17 and a gate electrode 18 are formed surrounding these columnar silicon layers. An N+ source diffusion layer 14 is formed through conventional doping methods or the like on top of the columnar silicon layer, and a silicide layer 15 is formed on the source diffusion layer. The contact 6a formed on top of the access transistor Qn11 is connected to the bit line BL1, the contact 7a formed on top of the gate wiring 18a extending from the gate electrode 18 of the access transistor Qn11 is connected to the word line WL1, and the contact 8b formed on top of the driver transistor Qn41 is connected to the ground potential wiring Vss1.

As shown in FIG. 3B, the P-well that is the first well 1a is formed in the surface region of the substrate and the lower diffusion layers on the substrate are separated by the isolation layer 2. The N+ drain diffusion layer 3a is formed through conventional doping methods or the like in the first memory node Qa comprising the lower diffusion layers on the substrate, and the N+ drain diffusion layer 5b is formed through conventional doping methods or the like in the second memory node Qb comprising the lower diffusion layers on the substrate. In addition, silicide layers 13a, 13b are formed on the surface of the N+ drain diffusion layers 3a, 5b. The contact 10a formed on the drain diffusion layer 3a is formed on the boundary area of the N+ drain diffusion layer 3a and the P+ drain diffusion layer 4a. Moreover, the contact 10a is connected via the memory node connection wiring Na1 to the contact 11b formed on the gate wiring 18b extending from the gate electrodes of the driver transistor Qn41 and the load transistor Qp21.

Figure 3C:
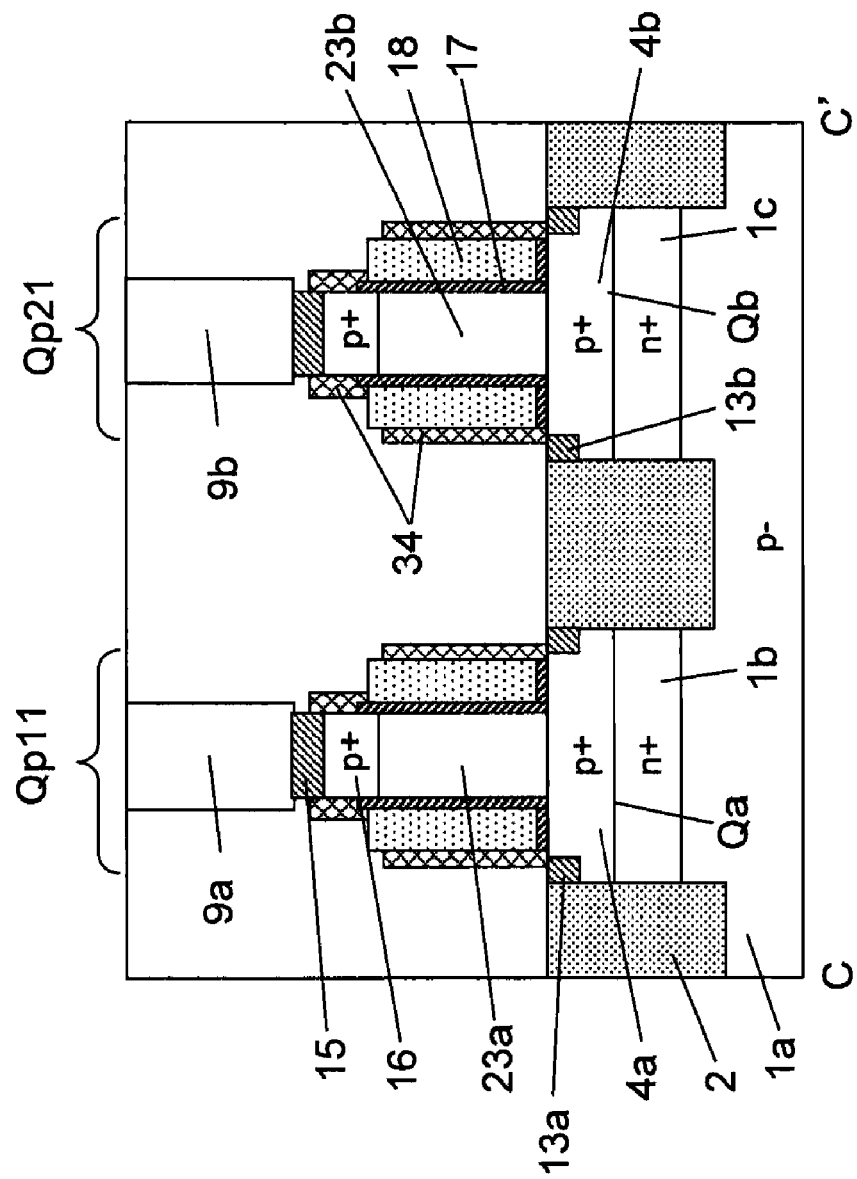
FIG. 3C is a cross-sectional view of the SRAM according to the first embodiment of the present application.

As shown in FIG. 3C, the P-well that is the first well 1a is formed in the surface region of the substrate and the lower diffusion layers on the substrate are separated by the isolation layer 2. The P+ drain diffusion layer 4a is formed through conventional doping methods or the like in the first memory node Qa comprising the lower diffusion layers on the substrate, and an P+ drain diffusion layer 4b is formed through conventional doping methods or the like in the second memory node Qb comprising the lower diffusion layers on the substrate. In addition, silicide layers 13a, 13b are formed on the surface of the P+ drain diffusion layers 4a, 4b. A first anti-leak N+ diffusion layer 1b having a conductive type differing from the first well 1a is formed at the bottom of the P+ lower diffusion layer 4a, which has the same conductive type as the first well 1a, in order to control leakage to the substrate. And, a second anti-leak N+ diffusion layer 1c having a conductive type differing from the first well 1a is formed at the bottom of the P+ diffusion layer 4b, which has the same conductive type as the first well 1a, in order to control leakage to the substrate.

A columnar silicon layer 23a constructing the load transistor Qp11 is formed on the P+ drain diffusion layer 4a, and a columnar silicon layer 23b constructing the load transistor Qp21 is formed on the P+ drain diffusion layer 4b. The gate insulating film 17 and the gate electrode 18 are formed surrounding each of these columnar silicon layers. A P+ source diffusion layer 16 is formed through conventional doping methods or the like on top of the columnar silicon layer, and a silicide layer 15 is formed on the surface of the source diffusion layer 16. Contacts 9a, 9b formed on top of the load transistors Qp11, Qp21 are both connected to the power source potential wiring Vcc1 via the wiring layer.

Figure 3D:
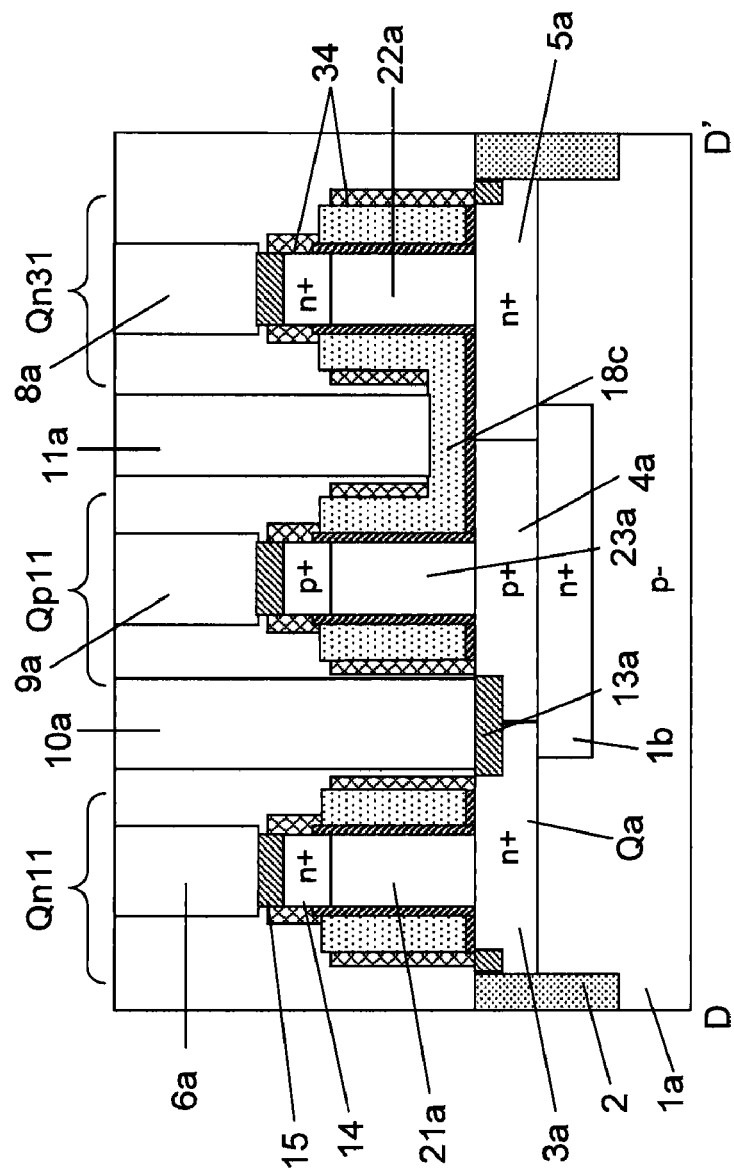
FIG. 3D is a cross-sectional view of the SRAM according to the first embodiment of the present application.
Figure 4A:
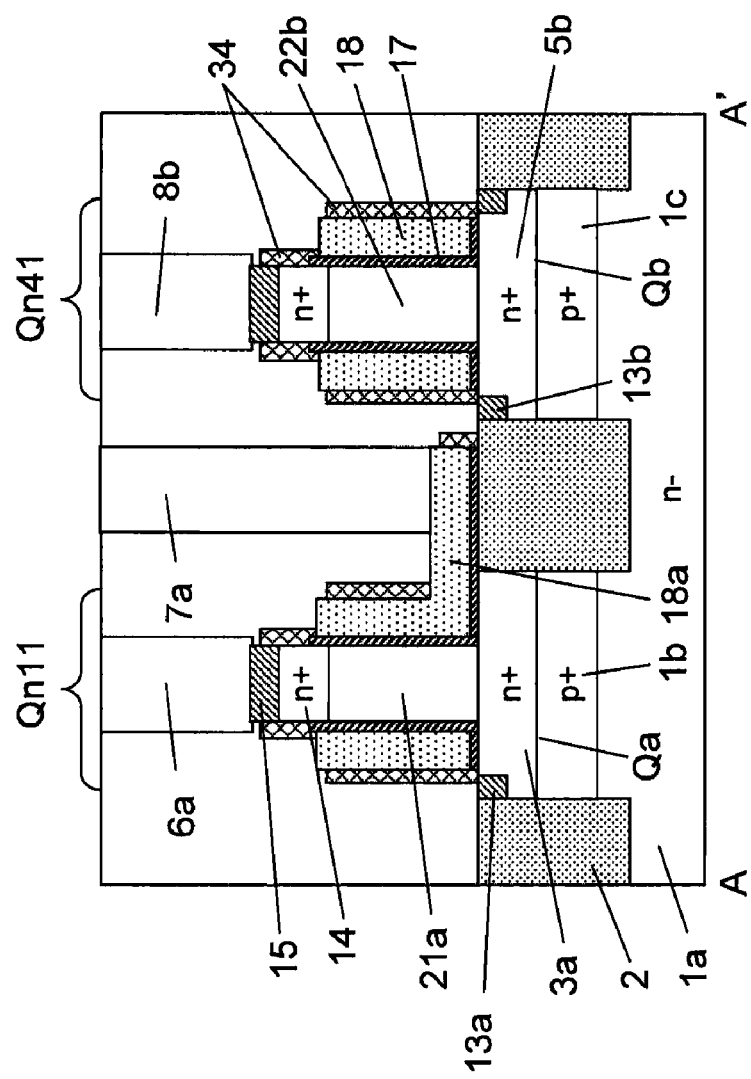
FIG. 4A is a cross-sectional view of the SRAM according to the first embodiment of the present application.
Figure 4B:
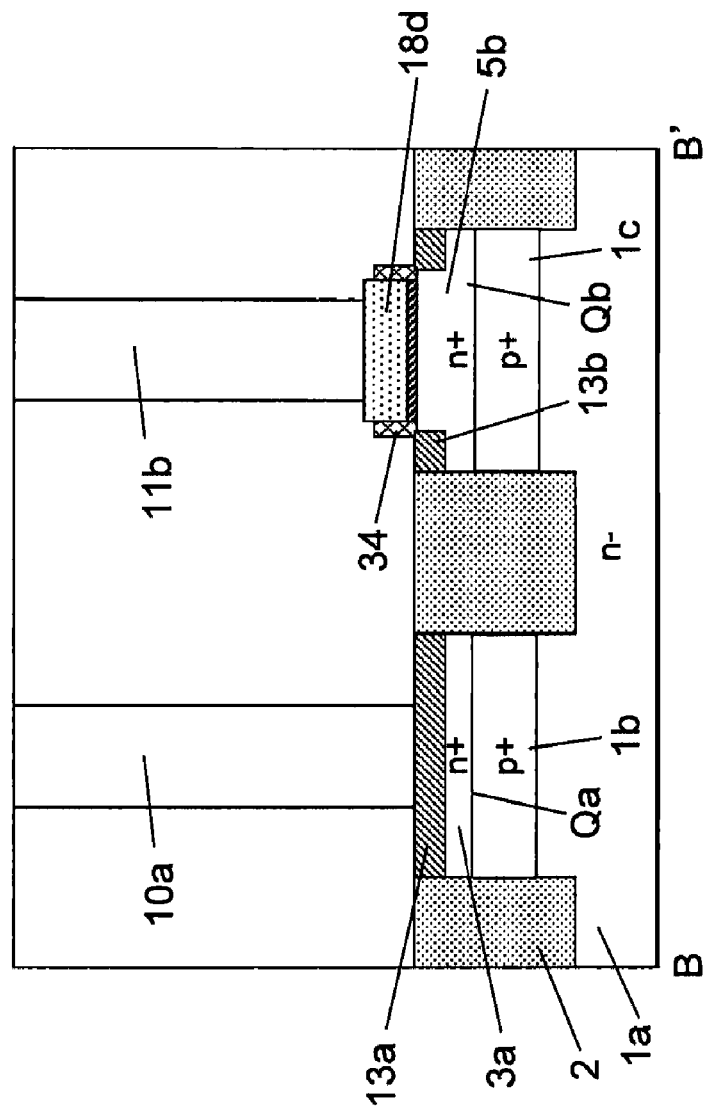
FIG. 4B is a cross-sectional view of the SRAM according to the first embodiment of the present application.
Figure 4D:
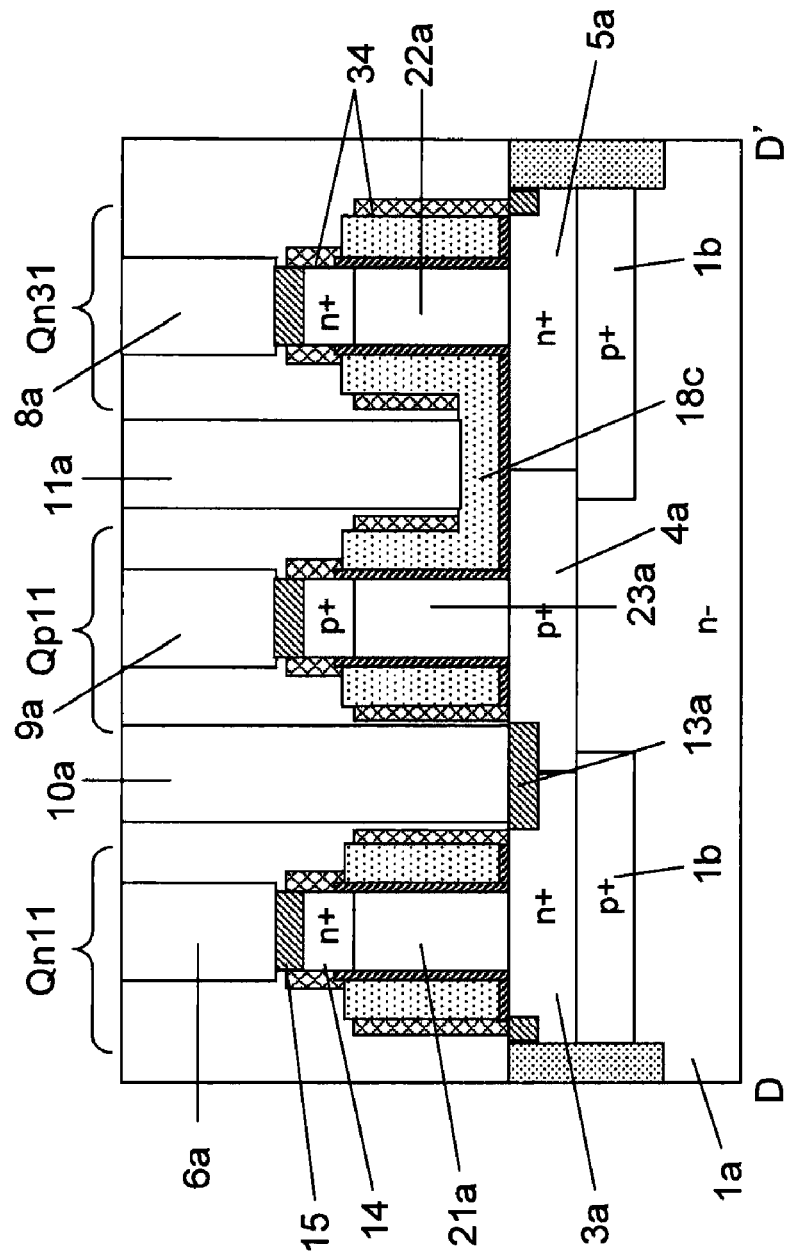
FIG. 4D is a cross-sectional view of the SRAM according to the first embodiment of the present application.

As shown in FIG. 3D, the P-well that is the first well 1a is formed in the surface region of the substrate and the lower diffusion layers on the substrate are separated by the isolation layer 2. The N+ drain diffusion layers 3a, 5a and the P+ drain diffusion layer 4a are formed through conventional doping methods or the like in the first memory node Qa comprising the lower diffusion layers on the substrate. The silicide layer 13a is formed on the surface of the drain diffusion layer, and the N+ drain diffusion layers 3a, 5a and the P+ drain diffusion layer 4a are directly connected through the silicide layer 13a. Therefore, it is not necessary to form an isolation layer for separating the N+ drain diffusion layers 3a, 5a and the P+ drain diffusion layer 4a or contacts for connecting the N+ drain diffusion layers 3a, 5a and the P+ drain diffusion layer 4a, and the memory cell surface area can be reduced. A first anti-leak diffusion layer 1b having a conductive type differing from the first well 1a is formed at the bottom of the P+ diffusion layer 4a, which is of the same conductive type as the first well 1a, in order to control leakage to the substrate.

A columnar silicon layer 21a constructing the access transistor Qn11 is formed on top of the N+ drain diffusion layer 3a, a columnar silicon layer 22a constructing the driver transistor Qn31 is formed on the N+ drain diffusion layer 5a, and a columnar silicon layer 23a constructing the load transistor Qn1 is formed on top of the P+ drain diffusion layer 4a. The N+ drain diffusion layer 3a, the P+ drain diffusion layer 4a and the N+ drain diffusion layer 5a are directly connected by the silicide layer 13a formed on the surface region of the various diffusion layers. The gate insulating film 17 and the gate electrode 18 are formed on each of the columnar silicon layers. The source diffusion layers are formed through conventional doping methods or the like on top of the respective columnar silicon layers, and the silicide layer 15 is formed on the source of the diffusion layers. The contact 6a formed on the access transistor Qn11 is operably connected to the bit line BL1, the contact 8a formed on the diver transistor Qn31 is operably connected to the ground potential wiring Vss1a and the contact 9a formed on the load transistor Qp11 is operably connected to the power source potential wiring Vcc1.

The gate electrodes of the driver transistor Qn31 and the load transistor Qp11 are connected to the common contact 11a on the gate wiring 18c extending from each of the gate electrodes. The contact 11a is connected to the contact 10b formed on the drain diffusion layer in the memory node 2b via the memory node connection wiring Nb1. The contact 10a formed on the boundary area of the drain diffusion layers 3a and 4a are connected to the contact 11b formed on the gate wiring 18d extending from the gate electrodes of the driver transistor Qn41 and the load transistor Qp21 via the memory node connection wiring Na1.

In this embodiment, the drain diffusion layers of the access transistor, driver transistor and load transistor are common and serve as the memory node of the SRAM through the N+ drain diffusion layers and the P+ drain diffusion layer formed on surface of the substrate being directly connected by a silicide layer formed on the surface of the diffusion layers. Consequently, an isolation layer to separate the N+ source drain diffusion layer and the P+ source drain diffusion layer needed in a regular planar-type transistor is unnecessary, and an isolation layer to separate only the two memory nodes of the SRAM is sufficient, making it possible to attain an extremely small SRAM cell surface area. In addition, the first and second anti-leak diffusion layers 1b, 1c having a conductive type differing from the first well 1a are formed at the bottoms of the drain diffusion layers having the same conductive type as the first well 1a to control leakage to the substrate.

As shown in FIGS. 4A to 4D, it is possible to similarly form an SRAM cell even in a structure in which the first well 1a is the N-well and first and second anti-leak P+ diffusion layers 1b, 1c are formed at the bottoms of the N+ lower diffusion layers, respectively.

One example of the manufacturing method for forming the semiconductor device according to this embodiment is explained below with reference to FIGS. 5A through 16B. In each of these drawings, A is a planar view and B is a cross-sectional view along the line D-D'.

Figure 5A:
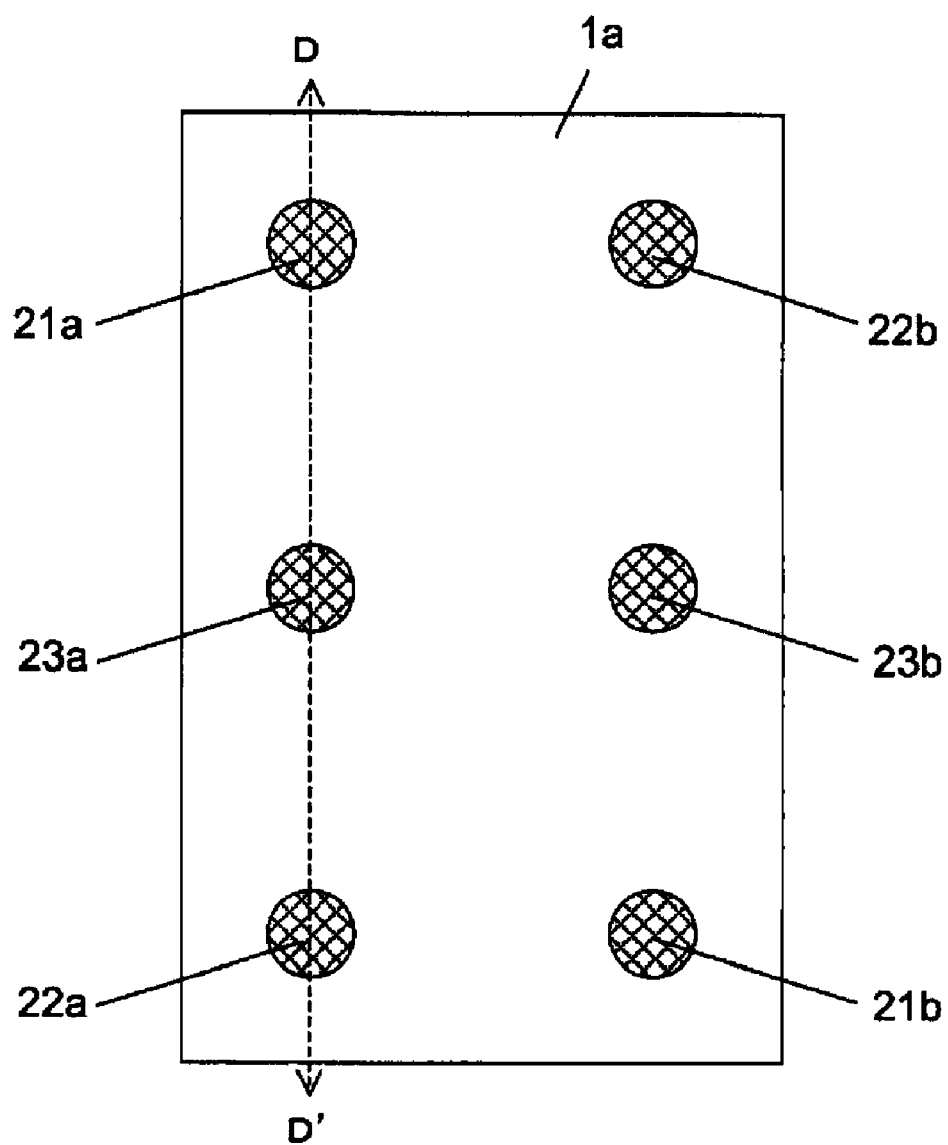
FIG. 5A is a process diagram showing the manufacturing method for the SRAM according to the first embodiment of the present application in process order.
Figure 5B:
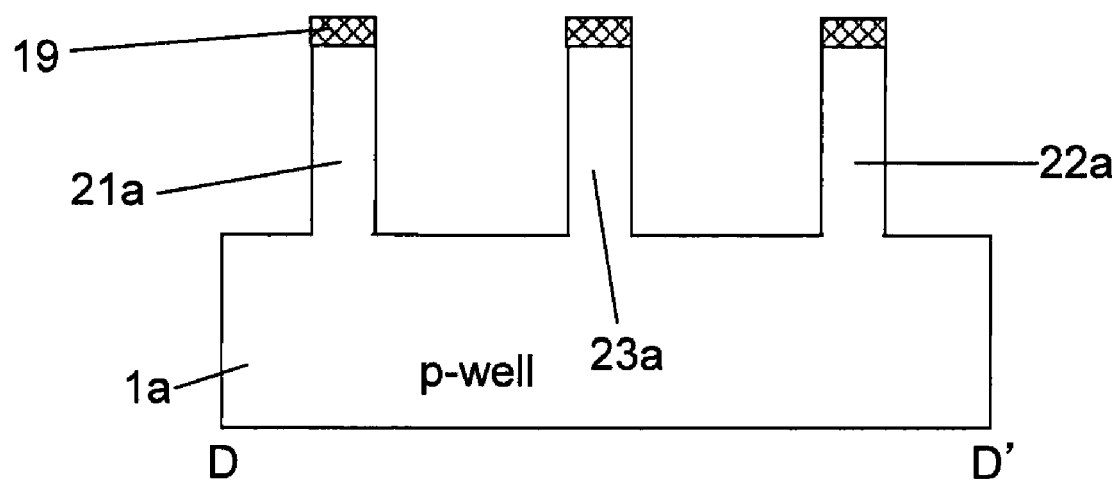
FIG. 5B is a process diagram showing the manufacturing method for the SRAM according to the first embodiment of the present application in process order.

As shown in FIGS. 5A and 5B, a mask 19 of silicon nitride film or the like is formed on the substrate. Subsequently, a columnar silicon layer 21a-23a, 21b-23b pattern is formed through lithography, and the columnar silicon layers 21a-23a, 21b-23b are formed through etching. Next, the P-well, which is the first well 1a, is formed in the SRAM cell array through conventional doping methods or the like.

Figure 6A:
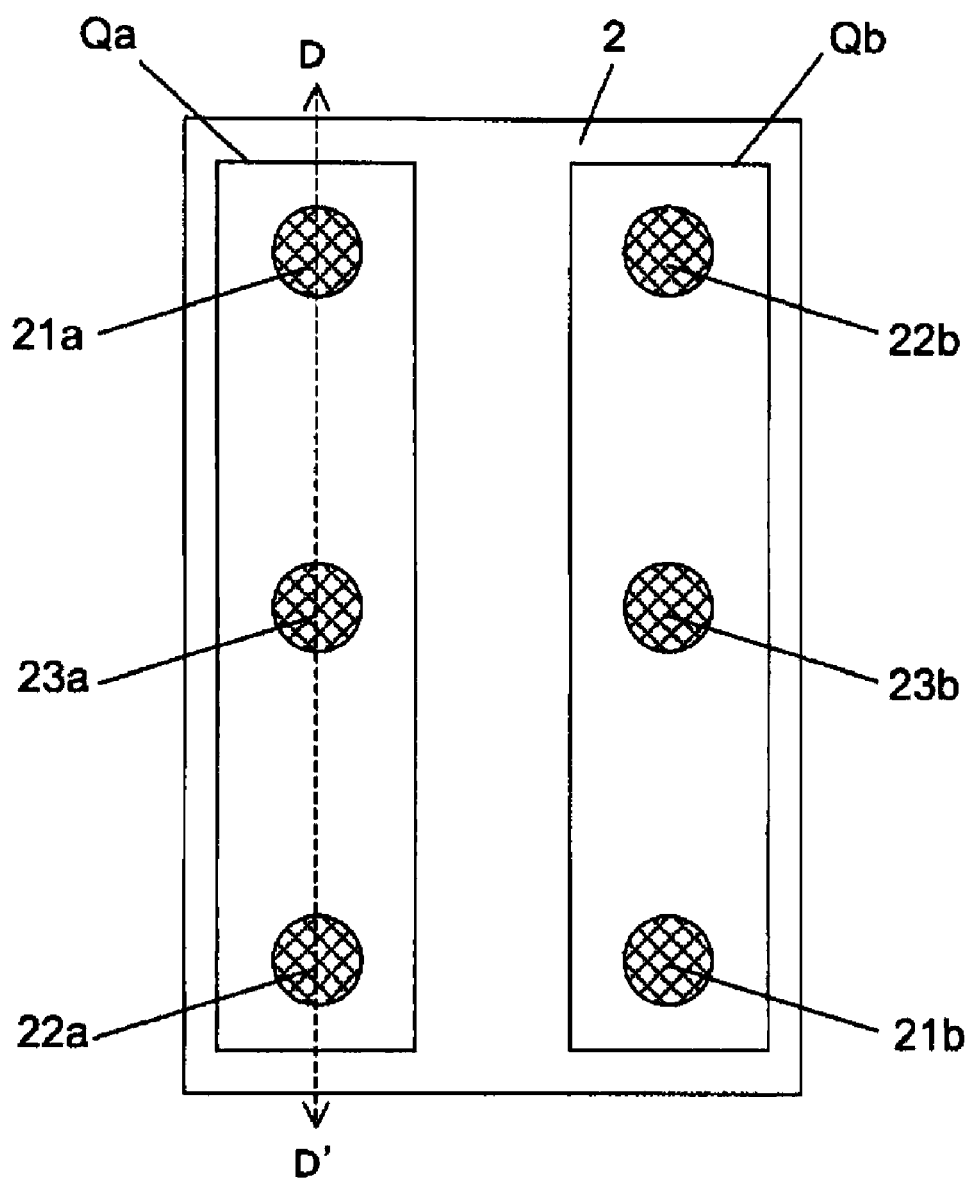
FIG. 6A is a process diagram showing the manufacturing method for the SRAM according to the first embodiment of the present application in process order.
Figure 6B:
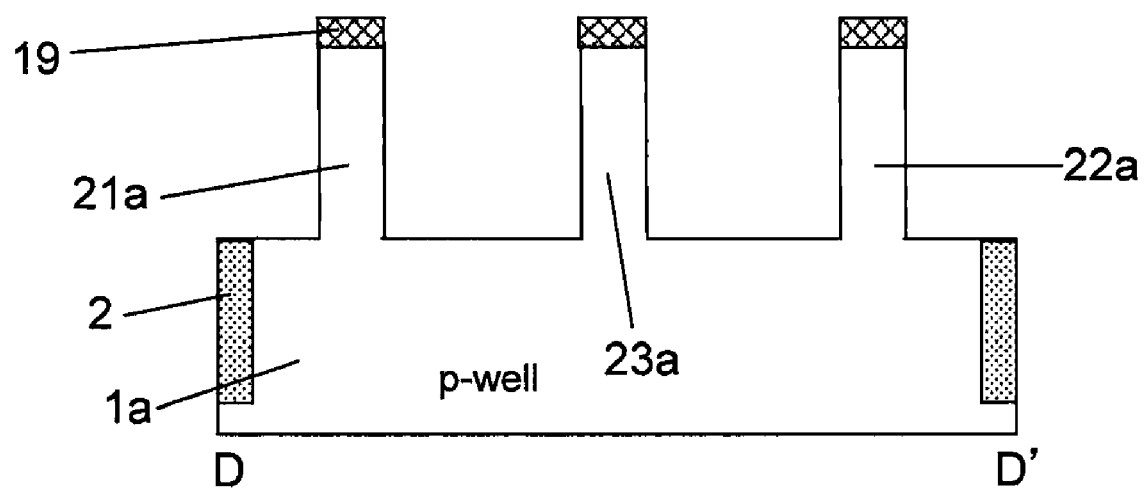
FIG. 6B is a process diagram showing the manufacturing method for the SRAM according to the first embodiment of the present application in process order.

As shown in FIGS. 6A and 6B, an isolation layer 2 is formed. The isolation layer 2 is formed by the method comprising the first step of etching a trench pattern, the step of forming a oxide film through embedding silica or the like in the trench with coating and CVD method, and the step of removing the excess oxide film on the substrate through dry etching or wet etching. Through these preferable steps, the pattern of the diffusion layers that serve as the first memory node Qa and the second memory node Qb are formed on the substrate.

Figure 7A:
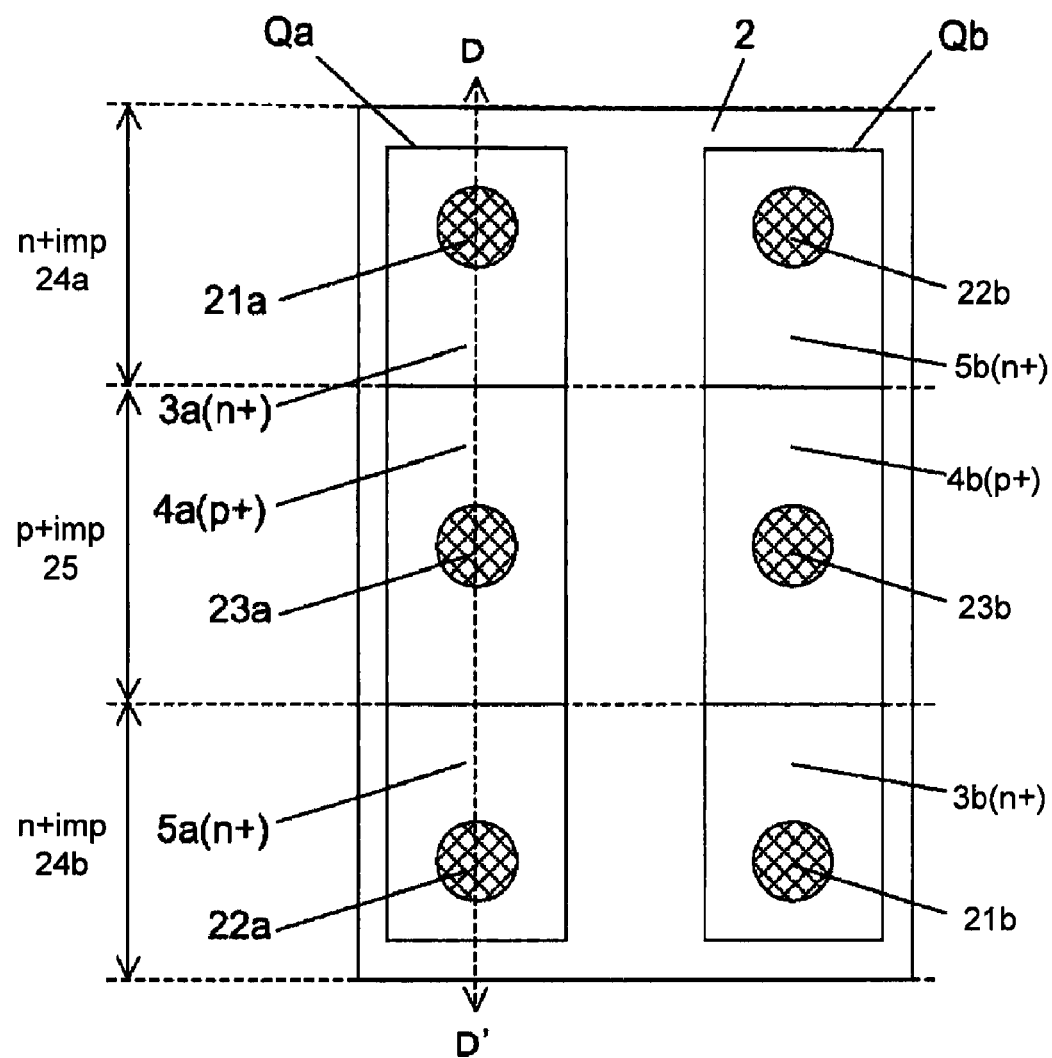
FIG. 7A is a process diagram showing the manufacturing method for the SRAM according to the first embodiment of the present application in process order.
Figure 7B:
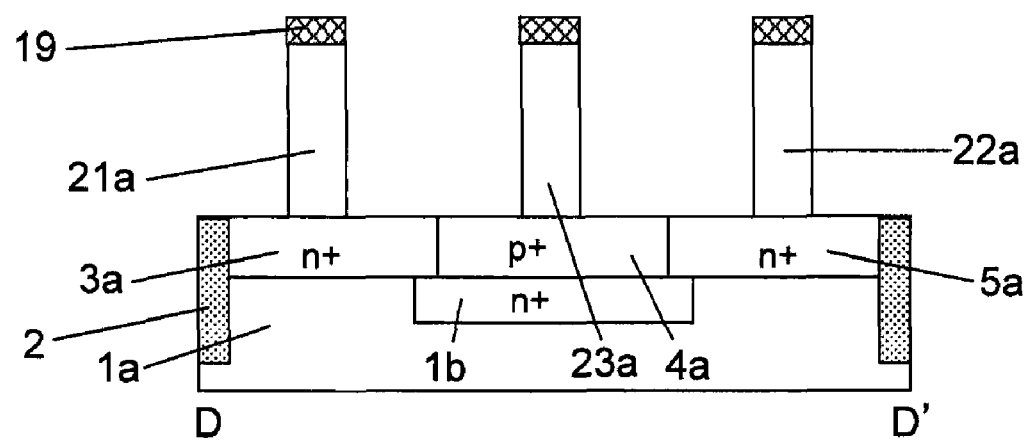
FIG. 7B is a process diagram showing the manufacturing method for the SRAM according to the first embodiment of the present application in process order.

As shown in FIGS. 7A and 7B, dopants are introduced through conventional ion doping methods or the like in the N+ doping regions 24a and 24b and the P+ doping region 25 to form the drain diffusion layers (3a, 4a and 5a) below the columnar silicon layers on the substrate. A first anti-leak N+ diffusion layer 1b is formed at the bottom of the P+ diffusion layer 4a, which has the same conductive type as the P-well that is the first well 1a, in order to control leakage to the substrate. The first anti-leak N+ diffusion layer 1b can be formed through conventional doping methods or the like with the mask of the P+ doping region 25. The first anti-leak N+ diffusion layer 1b is separated from that of the memory nodes by the isolation layer.

Figure 8A:
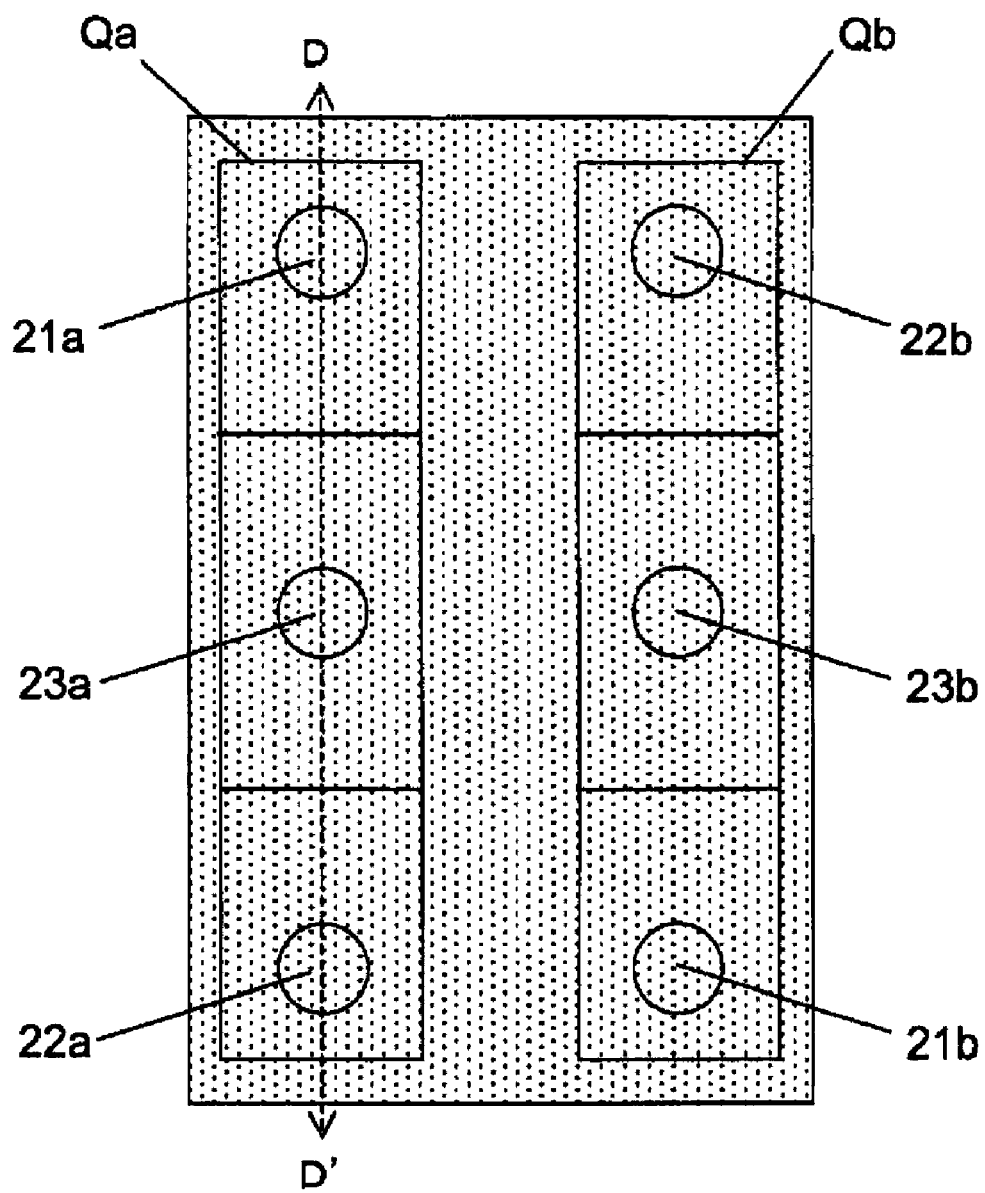
FIG. 8A is a process diagram showing the manufacturing method for the SRAM according to the first embodiment of the present application in process order.
Figure 8B:
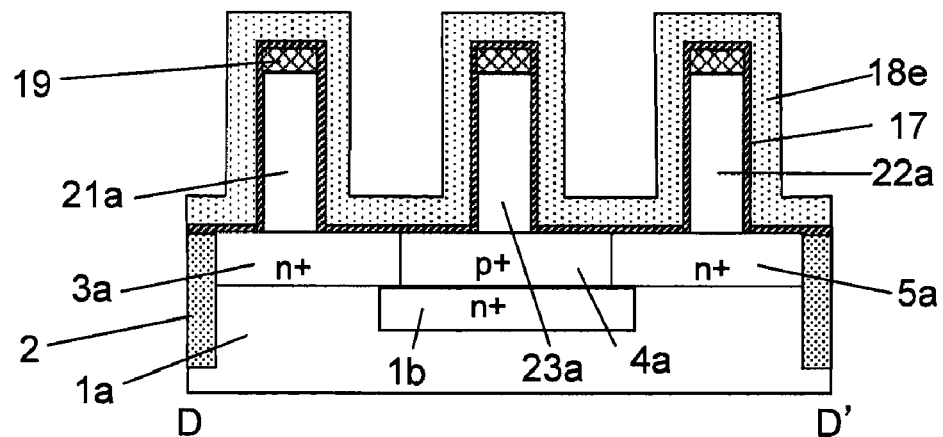
FIG. 8B is a process diagram showing the manufacturing method for the SRAM according to the first embodiment of the present application in process order.

As shown in FIGS. 8A and 8B, the gate insulating film 17 and the gate conductor film 18e are formed. The gate insulating film 17 is formed of an oxide film and a High-k film. In addition, the gate conductor film is formed of polysilicon or a metal film.

Figure 9A:
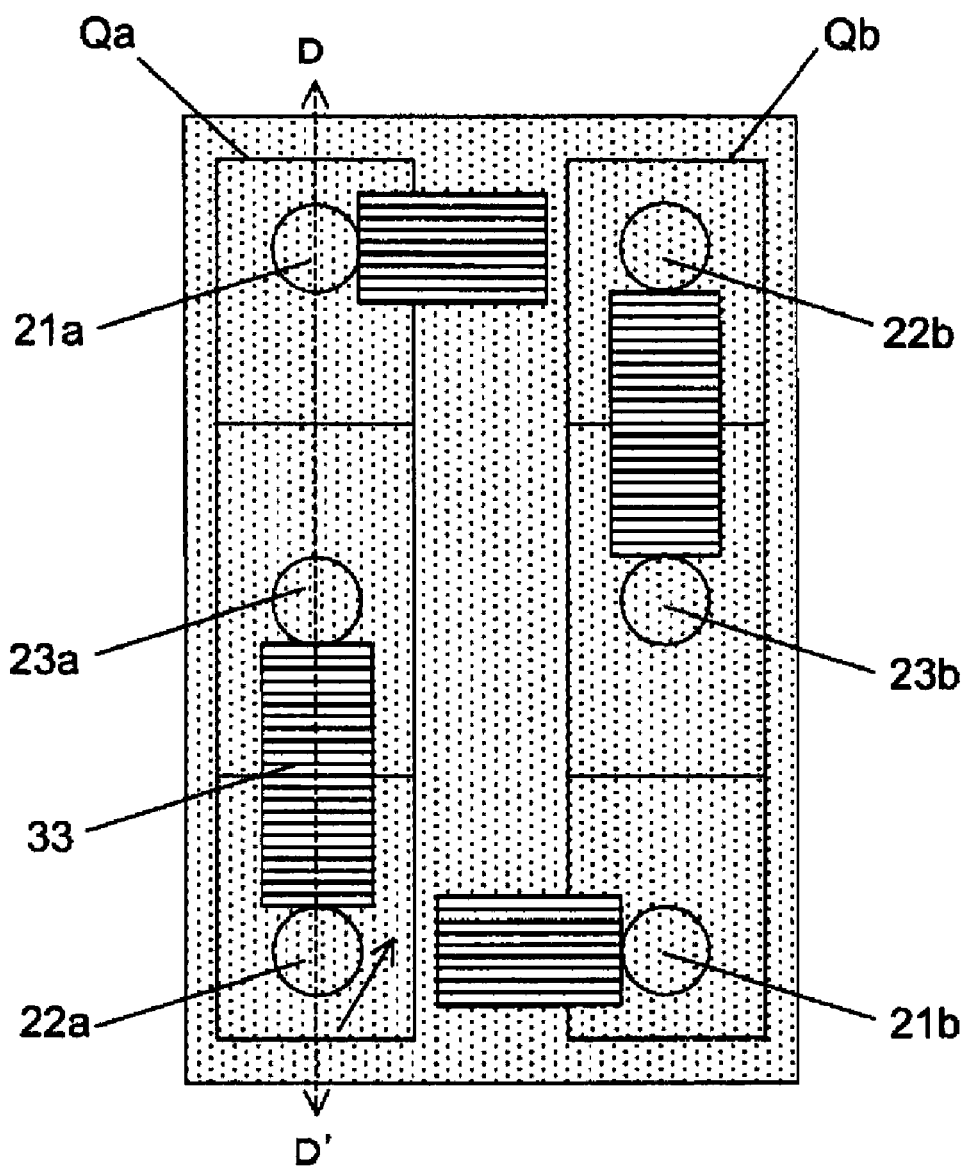
FIG. 9A is a process diagram showing the manufacturing method for the SRAM according to the first embodiment of the present application in process order.
Figure 9B:
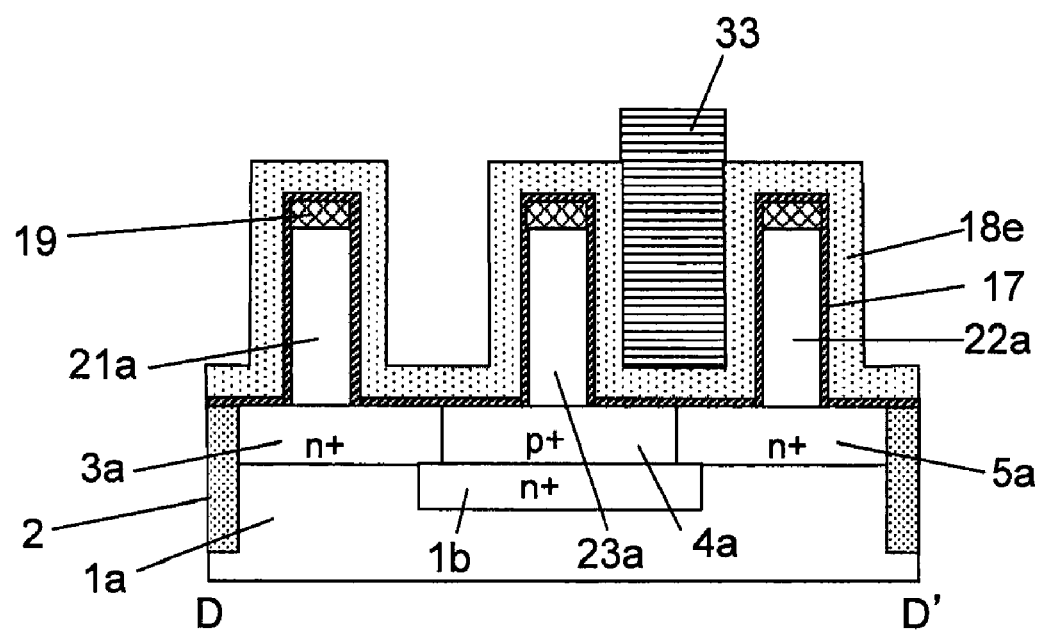
FIG. 9B is a process diagram showing the manufacturing method for the SRAM according to the first embodiment of the present application in process order.

As shown in FIGS. 9A and 9B, a gate wiring pattern is formed through lithography, using resist 33 and the like.

Figure 10A:
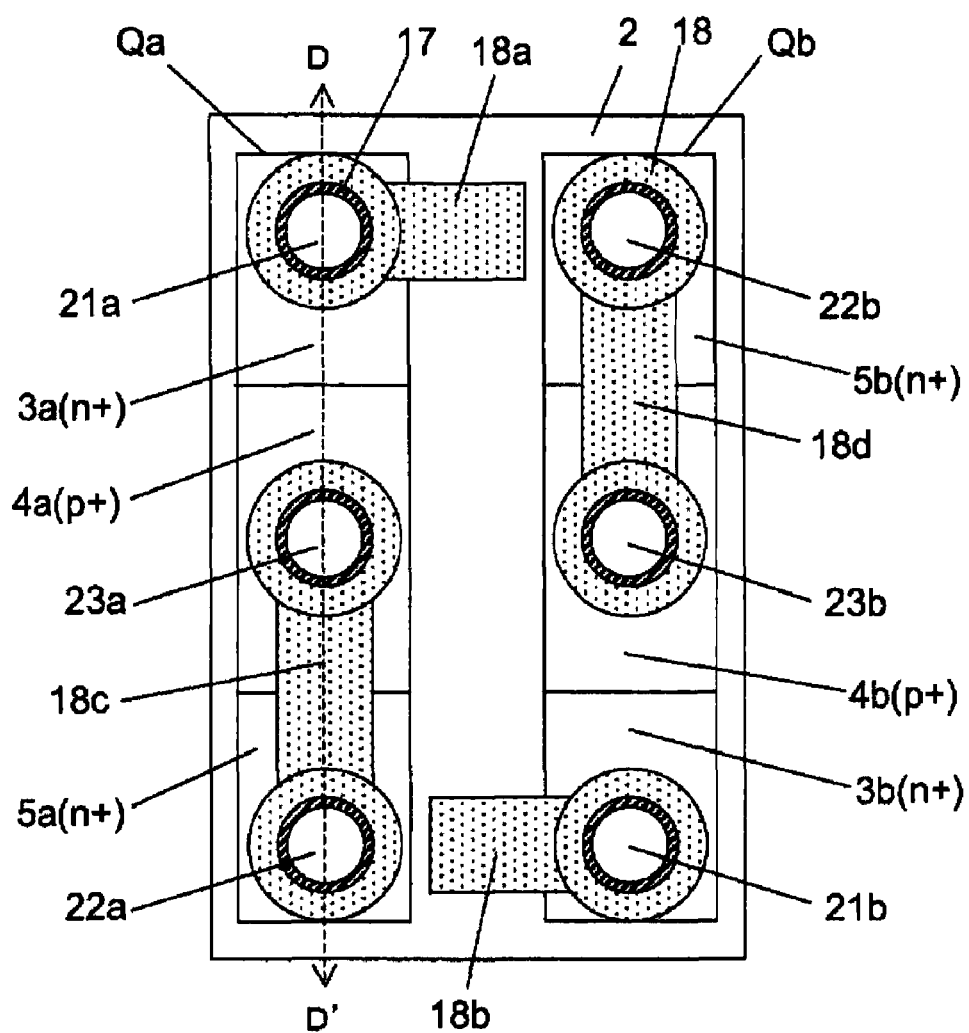
FIG. 10A is a process diagram showing the manufacturing method for the SRAM according to the first embodiment of the present application in process order.
Figure 10B:
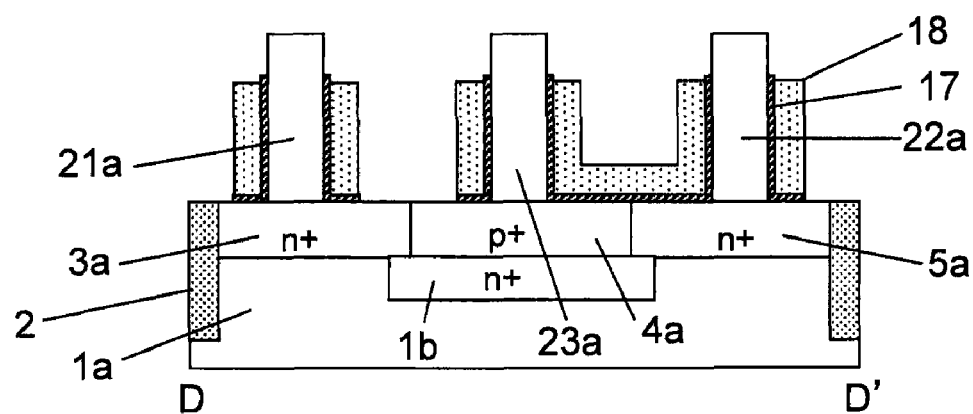
FIG. 10B is a process diagram showing the manufacturing method for the SRAM according to the first embodiment of the present application in process order.

As shown in FIGS. 10A and 10B, the gate insulating film 17 and the gate conductive film 18e are etched and removed, with the resist 33 as a mask. Through these steps, the gate wiring 18a-18d and the gate electrode 18 are formed. Then the mask on the pillars is removed.

Figure 11A:
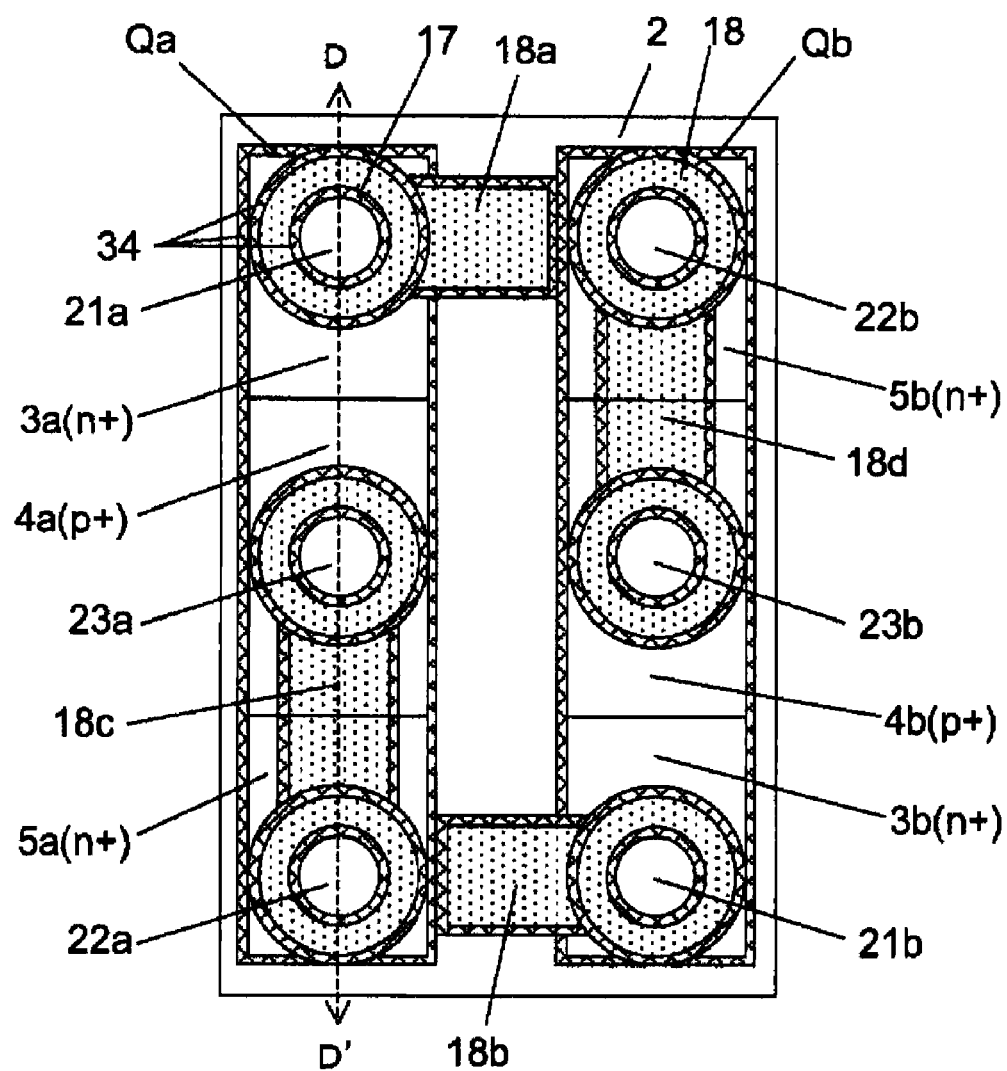
FIG. 11A is a process diagram showing the manufacturing method for the SRAM according to the first embodiment of the present application in process order.
Figure 11B:
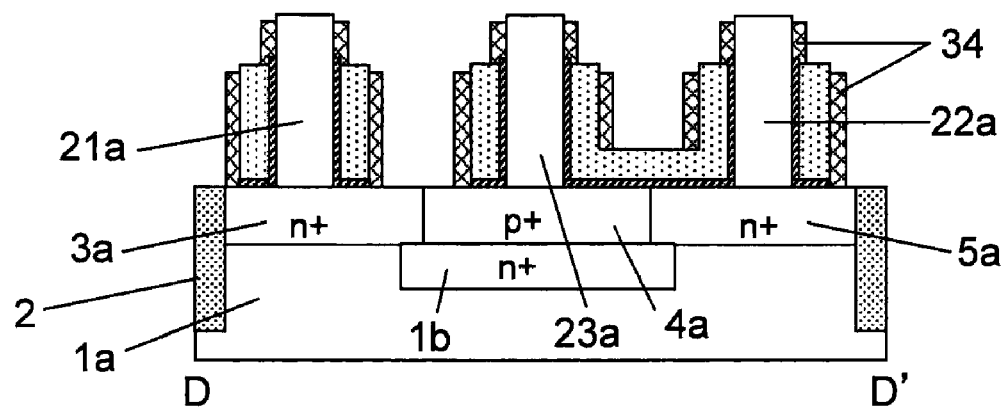
FIG. 11B is a process diagram showing the manufacturing method for the SRAM according to the first embodiment of the present application in process order.

As shown in FIGS. 11A and 11B, an insulating film of silicon nitride or the like is formed and then etched back to form a structure in which the side walls of the columnar silicon layers and the side walls of the gate electrodes are covered by the insulating film 34 of silicon nitride or the like.

Figure 12A:
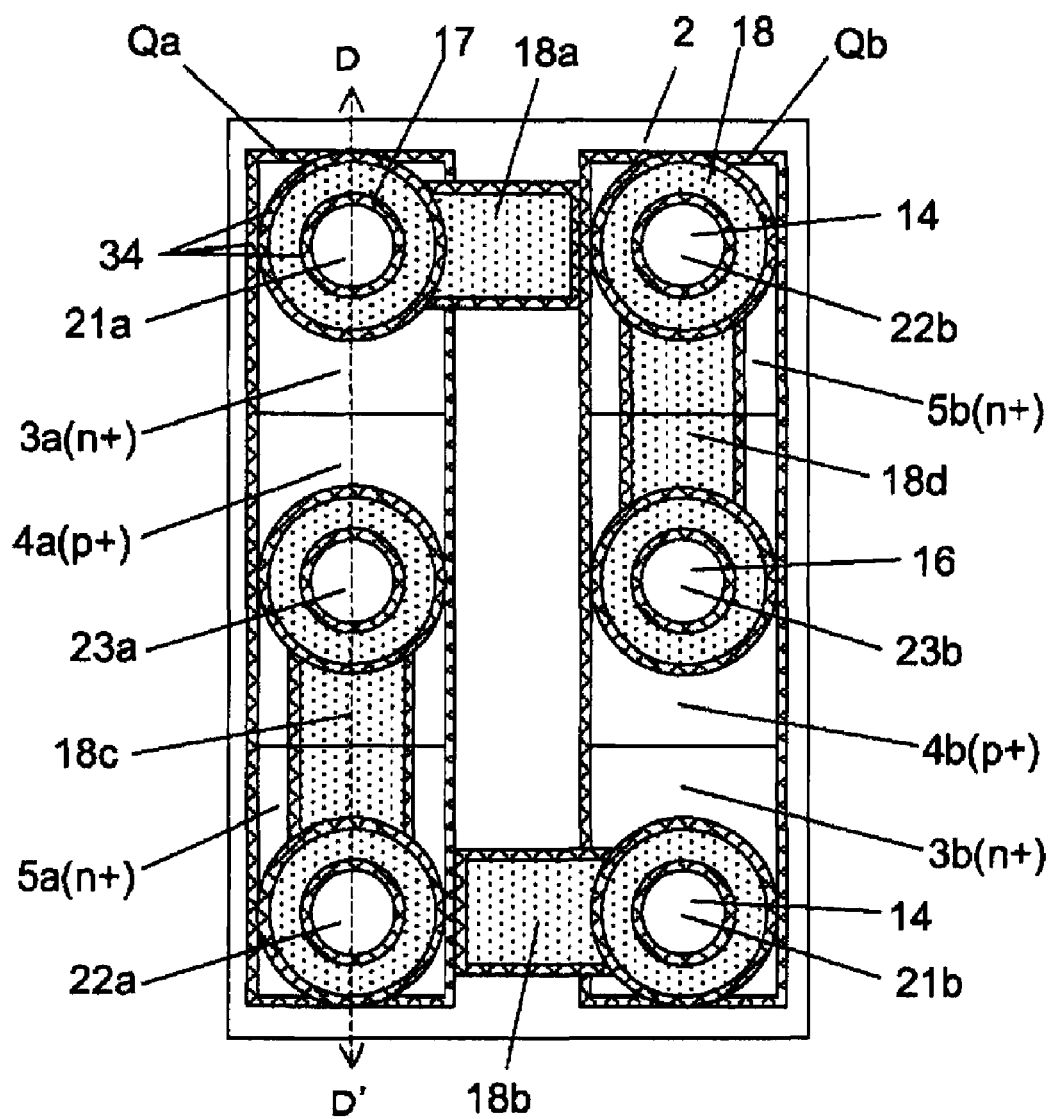
FIG. 12A is a process diagram showing the manufacturing method for the SRAM according to the first embodiment of the present application in process order.
Figure 12B:
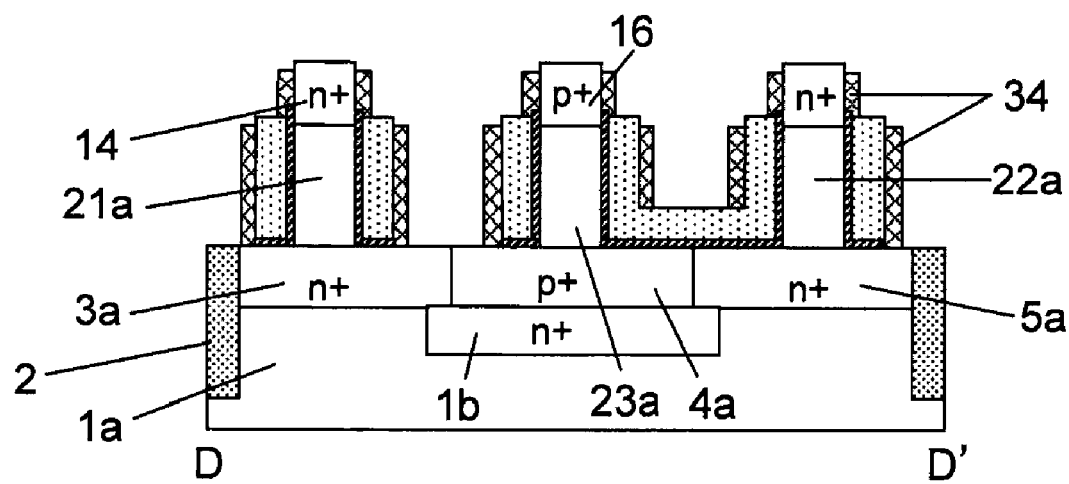
FIG. 12B is a process diagram showing the manufacturing method for the SRAM according to the first embodiment of the present application in process order.

As shown in FIGS. 12A and 12B, dopants are respectively introduced through conventional ion doping methods or the like into the N+ doping regions and the P+ doping region to form source diffusion layers 14, 16 on top of the columnar silicon layers.

Figure 13A:
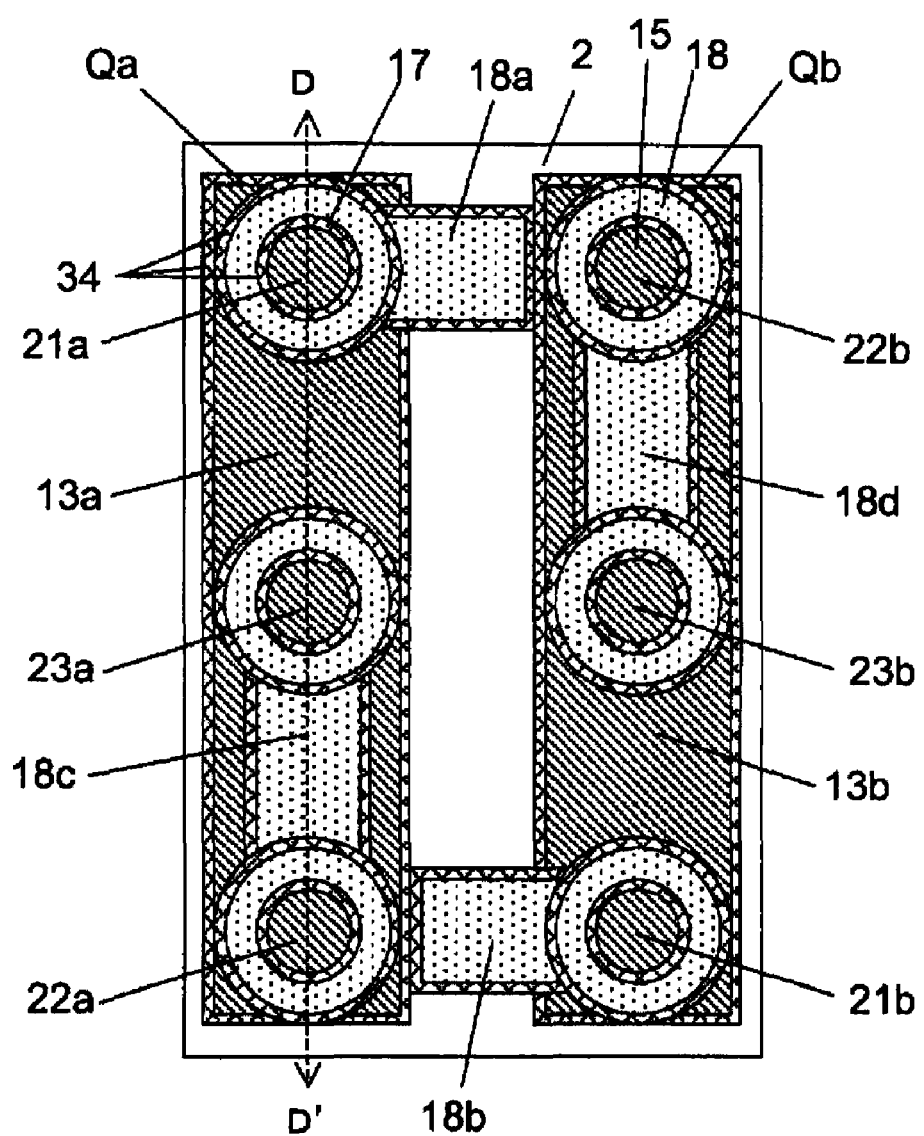
FIG. 13A is a process diagram showing the manufacturing method for the SRAM according to the first embodiment of the present application in process order.
Figure 13B:
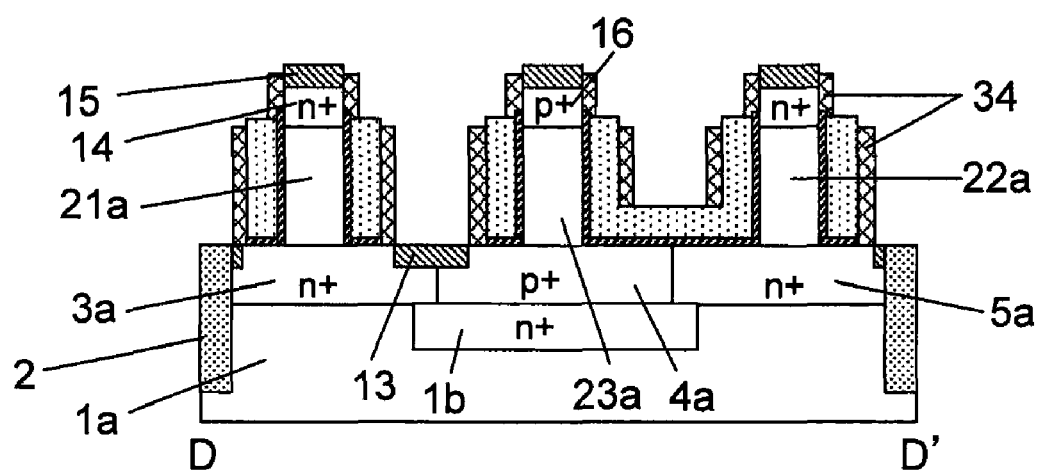
FIG. 13B is a process diagram showing the manufacturing method for the SRAM according to the first embodiment of the present application in process order.

As shown in FIGS. 13A and 13B, metal such as Co or Ni is sputtered on the substrate and the sputtered substrate is heattreated to selectively silicidize the source drain diffusion layers and form silicide layers 13a, 13b on the surface of the drain diffusion layers and a silicide layer 15 on the surface of the source diffusion layers on the columnar silicon layers.

Thus, it is possible to control shorts between the drain and gate and between the source and gate caused by the silicide layer, through the insulating film 34 formed of silicon nitride or the like covering the side wall of the gate electrodes and columnar silicon layers.

Figure 14A:
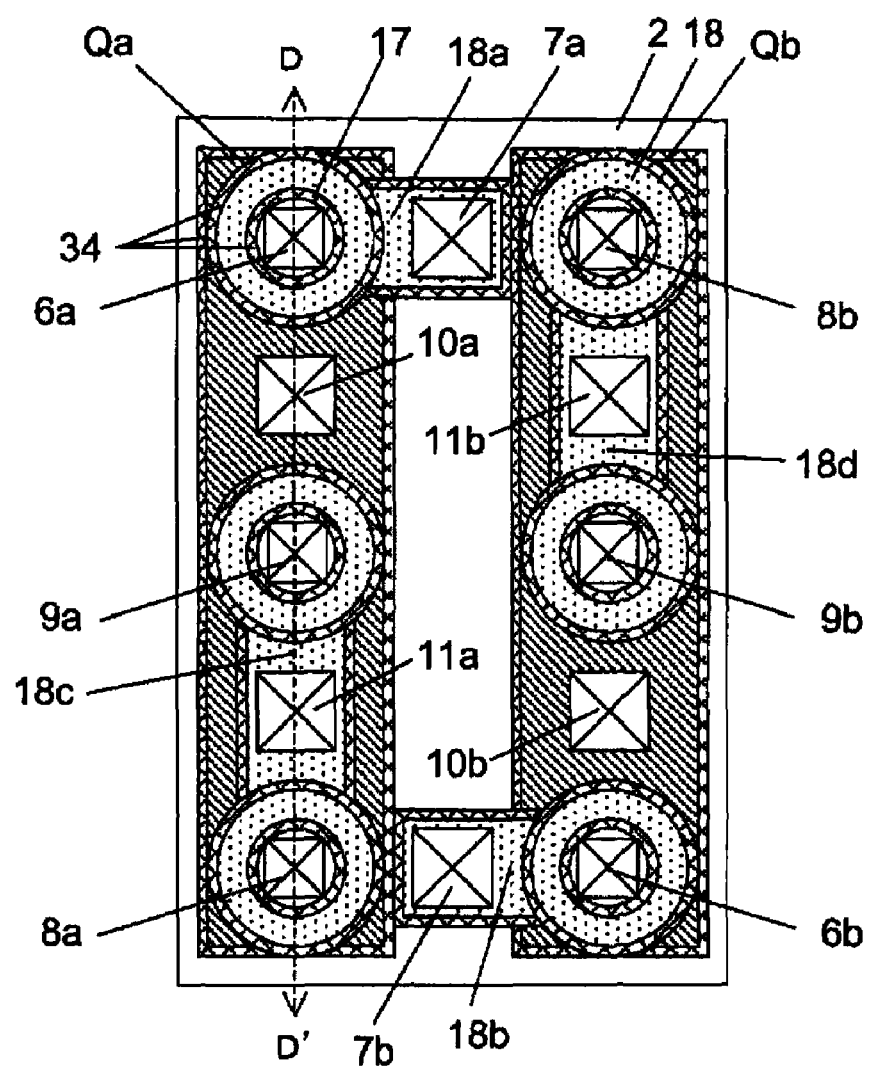
FIG. 14A is a process diagram showing the manufacturing method for the SRAM according to the first embodiment of the present application in process order.
Figure 14B:
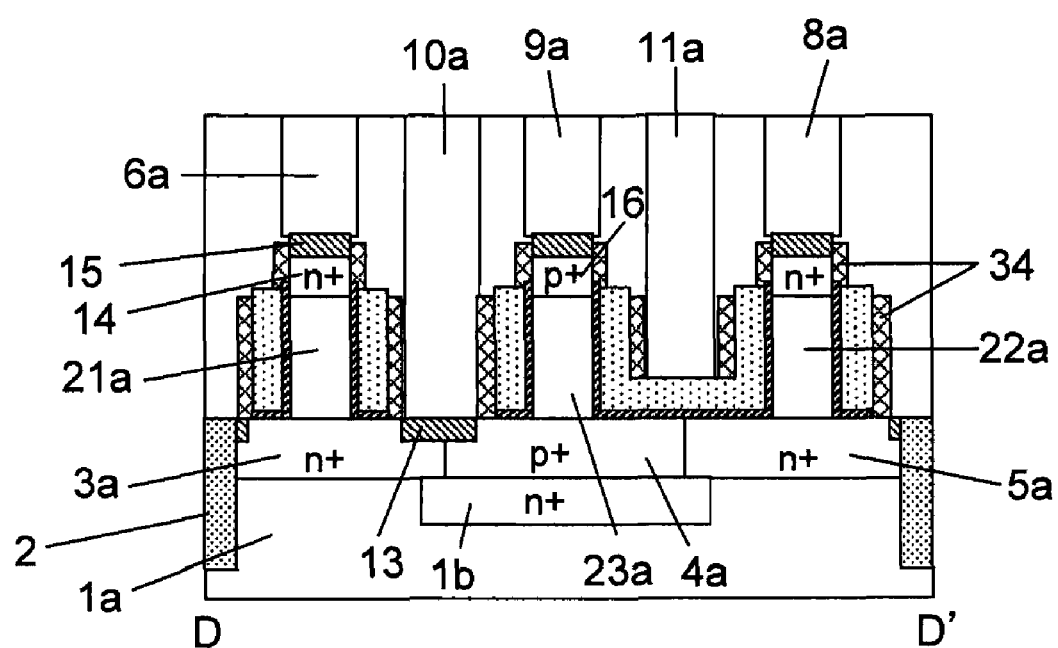
FIG. 14B is a process diagram showing the manufacturing method for the SRAM according to the first embodiment of the present application in process order.

As shown in FIGS. 14A and 14B, contacts 6a-11a, 6b-11b are formed after forming a silicon oxide film, which is an interlayer film.

Figure 15A:
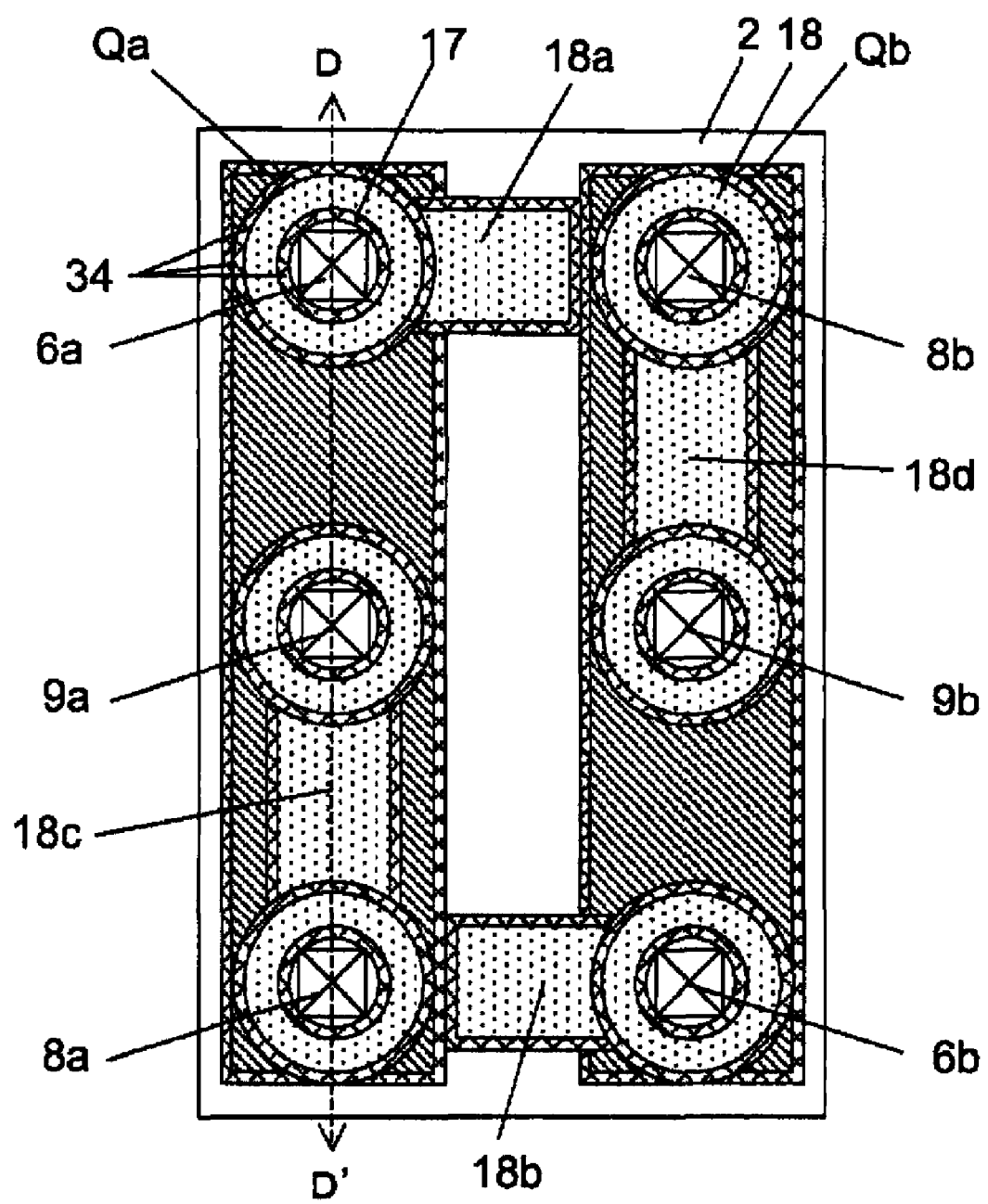
FIG. 15A is a process diagram showing the manufacturing method for the SRAM according to the first embodiment of the present application in process order.
Figure 15B:
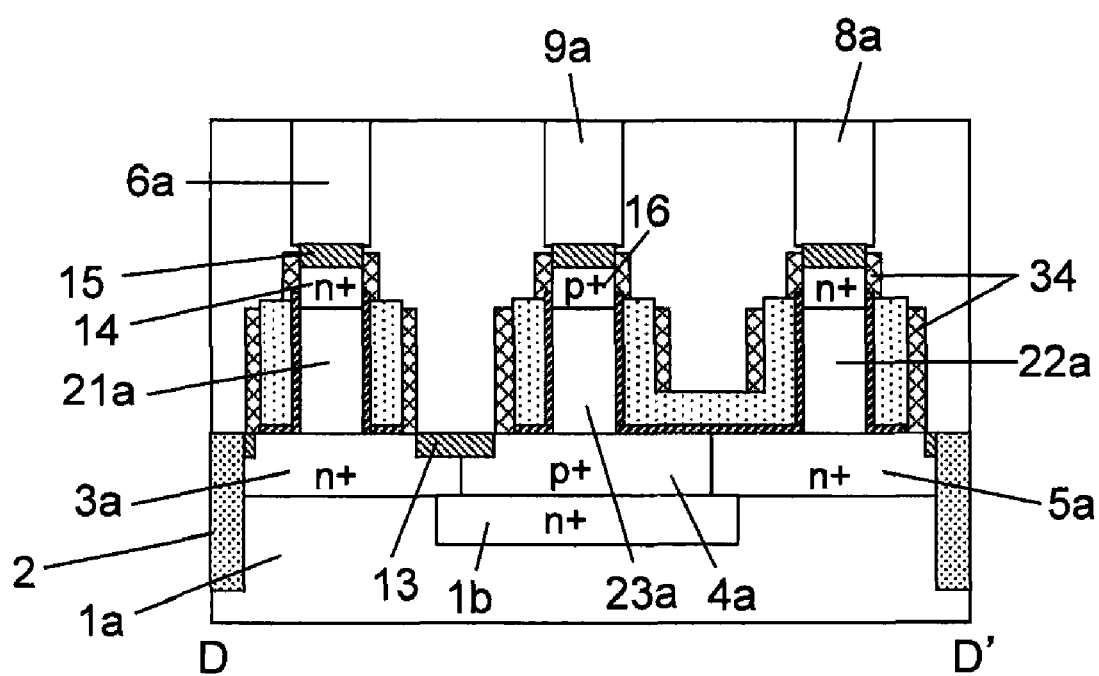
FIG. 15B is a process diagram showing the manufacturing method for the SRAM according to the first embodiment of the present application in process order.
Figure 16A:
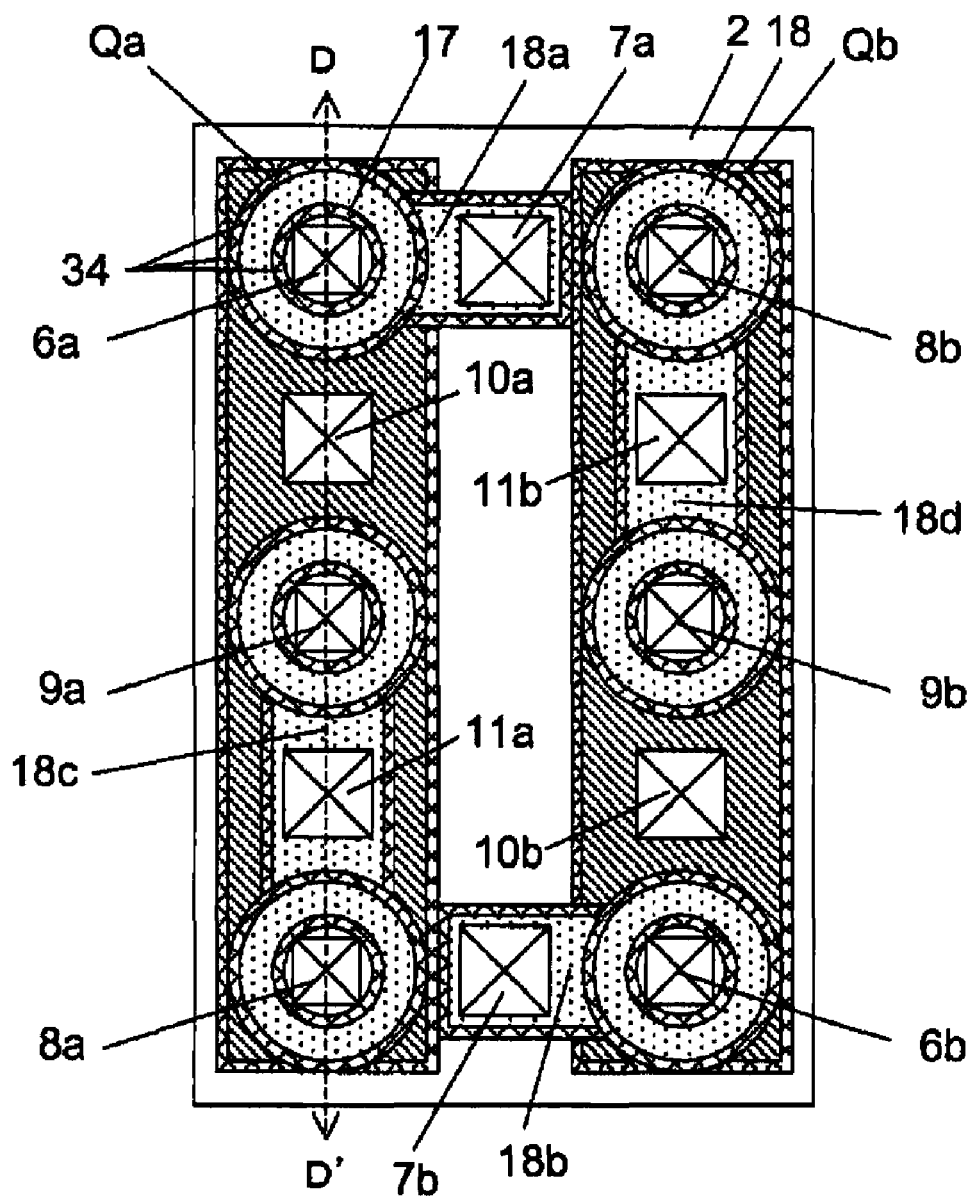
FIG. 16A is a process diagram showing the manufacturing method for the SRAM according to the first embodiment of the present application in process order.
Figure 16B:
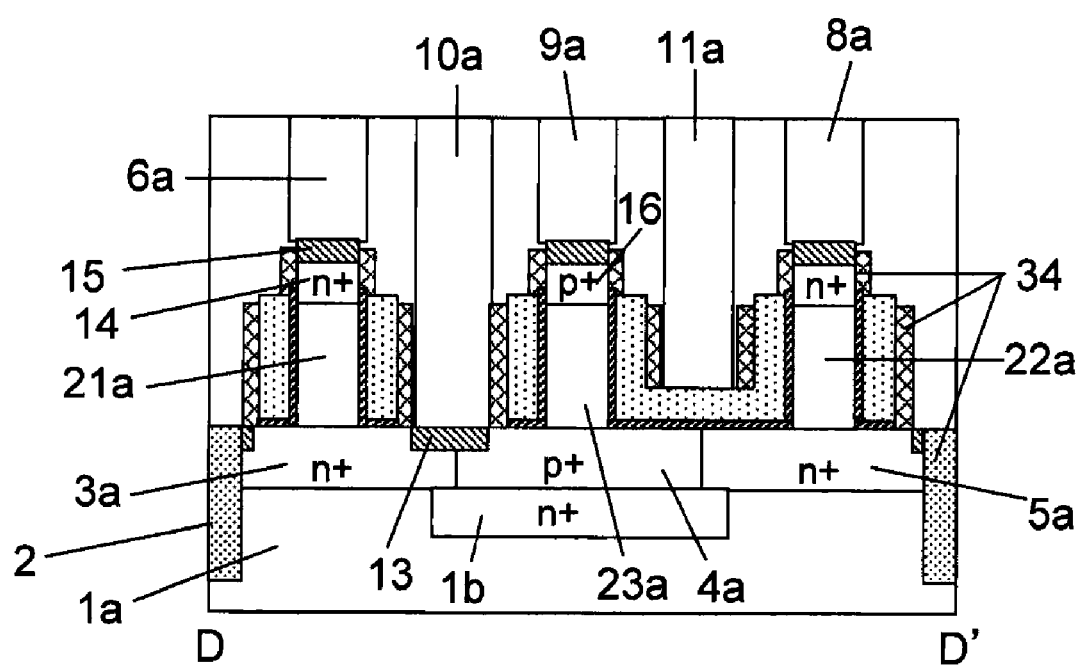
FIG. 16B is a process diagram showing the manufacturing method for the SRAM according to the first embodiment of the present application in process order.

As shown in FIGS. 15A and 15B, in the step of forming the contacts 6a, 8a, 9a, 6b, 8b, 9b, the contacts on the pillars are formed through a first lithography and etching step, and then, as shown in FIGS. 16A and 16B, the other contacts 7a, 10a, 11a, 7b, 10b, 11b are formed through a second lithography and etching step. Therefore, it is possible to reduce the minimum intervals between the contacts on the pillars and the other contacts and reduce the SRAM cell surface area.

Embodiment 2

Figure 17:
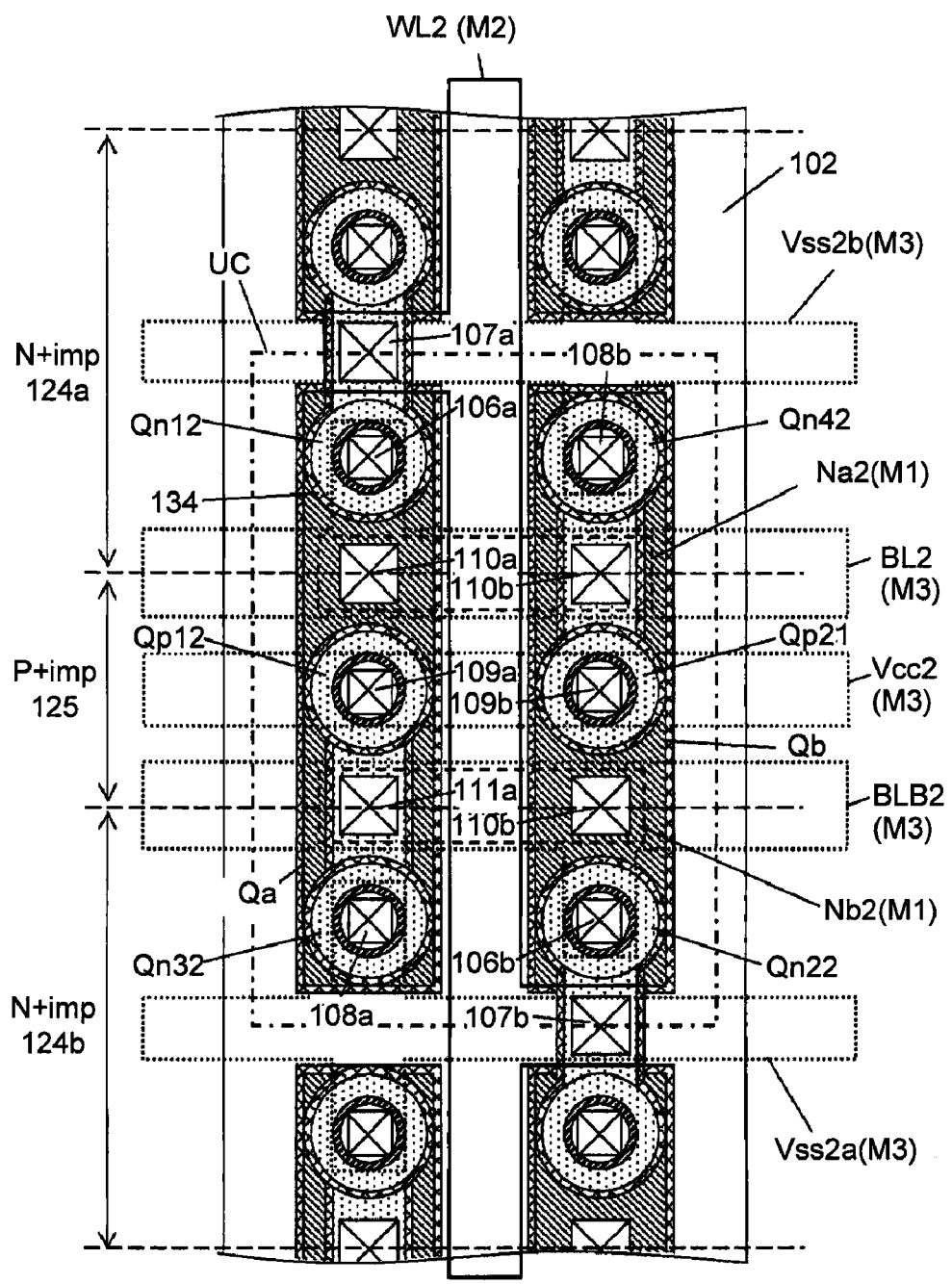
FIG. 17 is a planar view of the SRAM according to a second embodiment of the present application.

FIG. 17 shows an illustrative SRAM cell layout for this embodiment. In this embodiment, the transistors arranged in one column of the unit cell UC in FIG. 17 in the SRAM cell array have the same positioning arrangement as the transistors arranged in the second column of the memory cells adjacent to the unit cell UC on the top side and the bottom side. Moreover, the transistors arranged in the second column of the unit cell UC have the same positioning arrangement as the transistors arranged in the first column of the memory cells adjacent to the unit cell UC on the top side and the bottom side. That is to say, on the top side of the transistors Qn12, Qp12 and Qn32 arranged in the first column of the unit cell UC in FIG. 17, the same transistors as transistors Qn42, Qp22 and Qn22 arranged in the second column are arranged, in order from the top. Accordingly, an access transistor is arranged adjacent to the top side of the access transistor Qn12 in the drawing, and an access transistor is arranged adjacent to the bottom side of the access transistor Qn22 in the drawing. By arranging the SRAM cells in this manner, the gate wiring extending from the gate electrode of the access transistor Qn12 is connected to the gate electrode of the access transistor of the memory cell adjacent on the top side in the drawing, so it possible to share the contacts 107a, 107b to the word line WL2 on that gate wiring. In embodiment 1, the contacts 7a, 7b to the word line WL1 were formed in the area between the first memory node and the second memory node, but in this embodiment, they are positioned on the boundary between upper and lower SRAM cells, so it is possible to reduce the space between memory nodes. In terms of the drawing, it is possible to reduce the length of the SRAM cell in the horizontal direction.

The above-described sharing of contacts among gate electrodes in the access transistors can be applied to the transistors arranged as in Embodiment 1. For example, the gate wiring from the gate electrode of the access transistor Qn11 in FIG. 2 may be extended in the upward right direction in the figure, and connect to the gate wiring extending in the downward left direction from the gate electrode of the access transistor arranged above and to the right of Qn11, and share the contacts on the connected gate wiring. In this manner, by simply having the arrangement of access transistors in adjacent memory cells such that the gate electrodes are arranged adjacently, it is possible to share the contacts to the word line.

In addition, as stated in the first embodiment, the word line wiring, the bit line wiring, the power source potential wiring and the ground potential wiring are preferably positioned on the layer above the node connection wiring which is the wiring within each memory cell, and thus are shared with the wiring of other memory cells. As one example of the arrangement of layered wiring on this point, it is possible to attain an arrangement in which the node connection wiring Na2, Nb2 is wired in the lower layer, the word line WL2 is wired in the middle layer, and the bit line wiring BL2, BLB2, the power source potential wiring Vcc2 and the ground potential wiring Vss2a, Vss2b are wired in the upper layer so that these wirings may avoid making any unsafe contact.

The subsequent arrangement is the same as that of embodiment 1, so the arrangement's description will be omitted.

Embodiment 3

Figure 18:
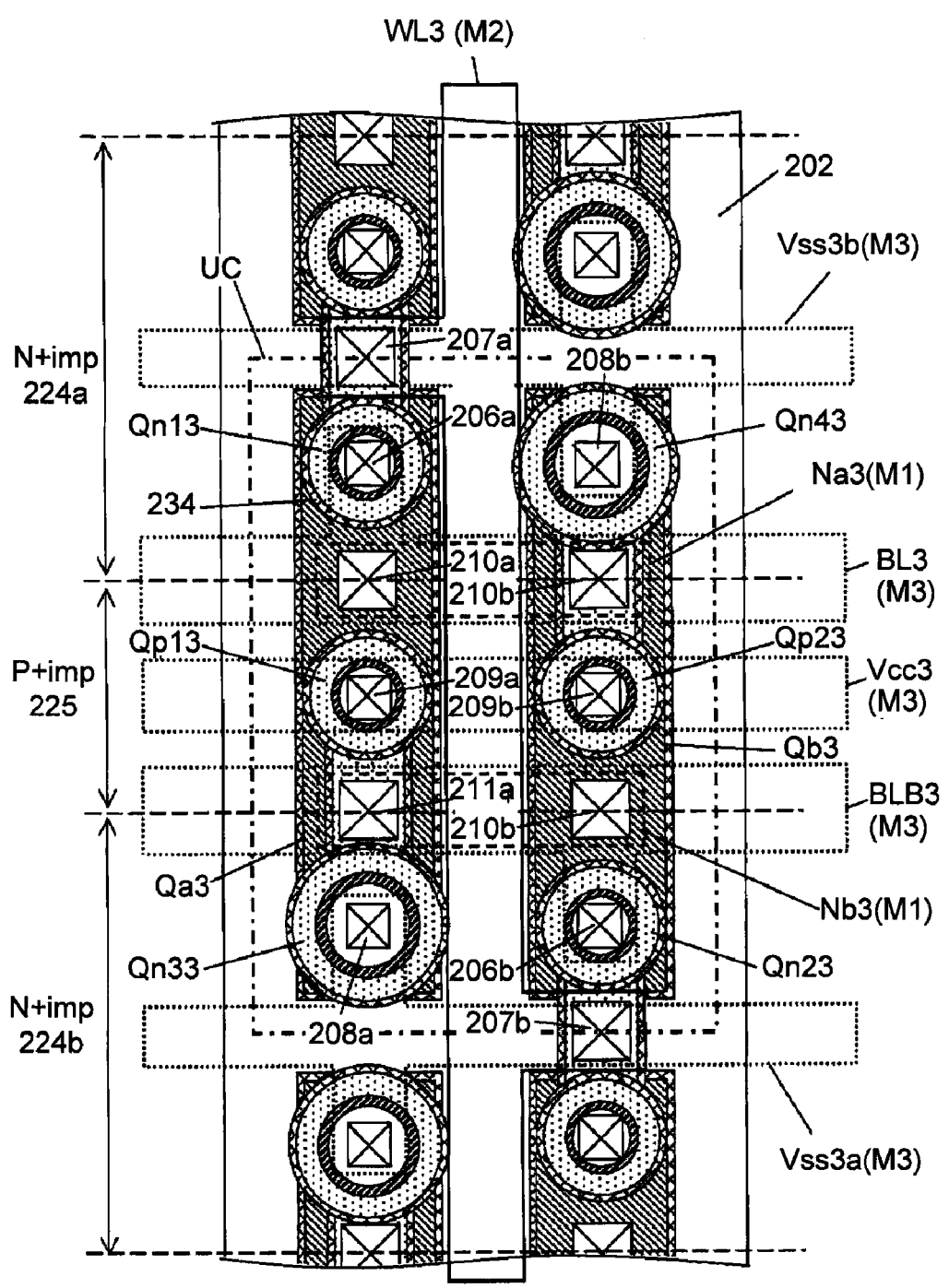
FIG. 18 is a planar view of the SRAM according to a third embodiment of the present application.

FIG. 18 shows an illustrative SRAM layout for this embodiment. In this embodiment, the difference from embodiment 2 is in a preferred shape of the columnar silicon layer that forms the driver transistor. In 6T-SRAM, in many cases the drain current of the driver transistors is generally set larger than the drain current of the access transistors in order to secure an operating margin during normal readout. In the case of a planar transistor, the drain current can be increased by making the diffusion layer width of the driver transistor larger than the diffusion layer width of the access transistor. In the case of an SGT, it is possible to increase the drain current by enlarging the diameter of the columnar silicon layer and making the circumference of the side wall of the columnar silicon layer forming the driver transistor greater than the circumference of the side wall of the columnar silicon layer forming the access transistor. As shown in FIG. 18, by making the diameter of the columnar silicon layer forming the driver transistor larger than the columnar silicon layers of the other transistors, it is possible to improve the readout margin. However, it should be considered that the short channel effect occurs more readily when the dimensions of the columnar silicon layer are enlarged. In addition, the shape of the columnar silicon layer need not be circular. The shape of the columnar silicon layer may be in an elliptical or rectangular shape in order to lengthen the circumference of the columnar silicon layer.

In addition, the circumference of the side wall of the columnar silicon layer forming the load transistor may be less than the circumference of the side wall of the columnar silicon layer forming the access transistor by enlarging the diameter of the access transistor and increasing the drain current value of the access transistor in order to increase operating speed, or by reducing the diameter of the load transistor and making the drain current of the load transistor relatively lower than the other transistors in order to improve write margins. In this manner, it is possible to adjust the properties of the various types of SRAM by changing the respective shapes of the access transistor, the driver transistor and the load transistor.

As described in the first embodiment, the word line wiring, the bit line wiring, the power source potential wiring and the ground potential wiring are preferably positioned on the layer above the node connection wiring, which is the wiring within each memory cell, so as to be shared with the wiring of other memory cells. As one example of the arrangement of layered wiring on this point, the same arrangement as in above-described embodiment 2 can be attained.

The subsequent arrangement is the same as that of embodiment 2, so the arrangement's description will be omitted.

Embodiment 4

Figure 19:
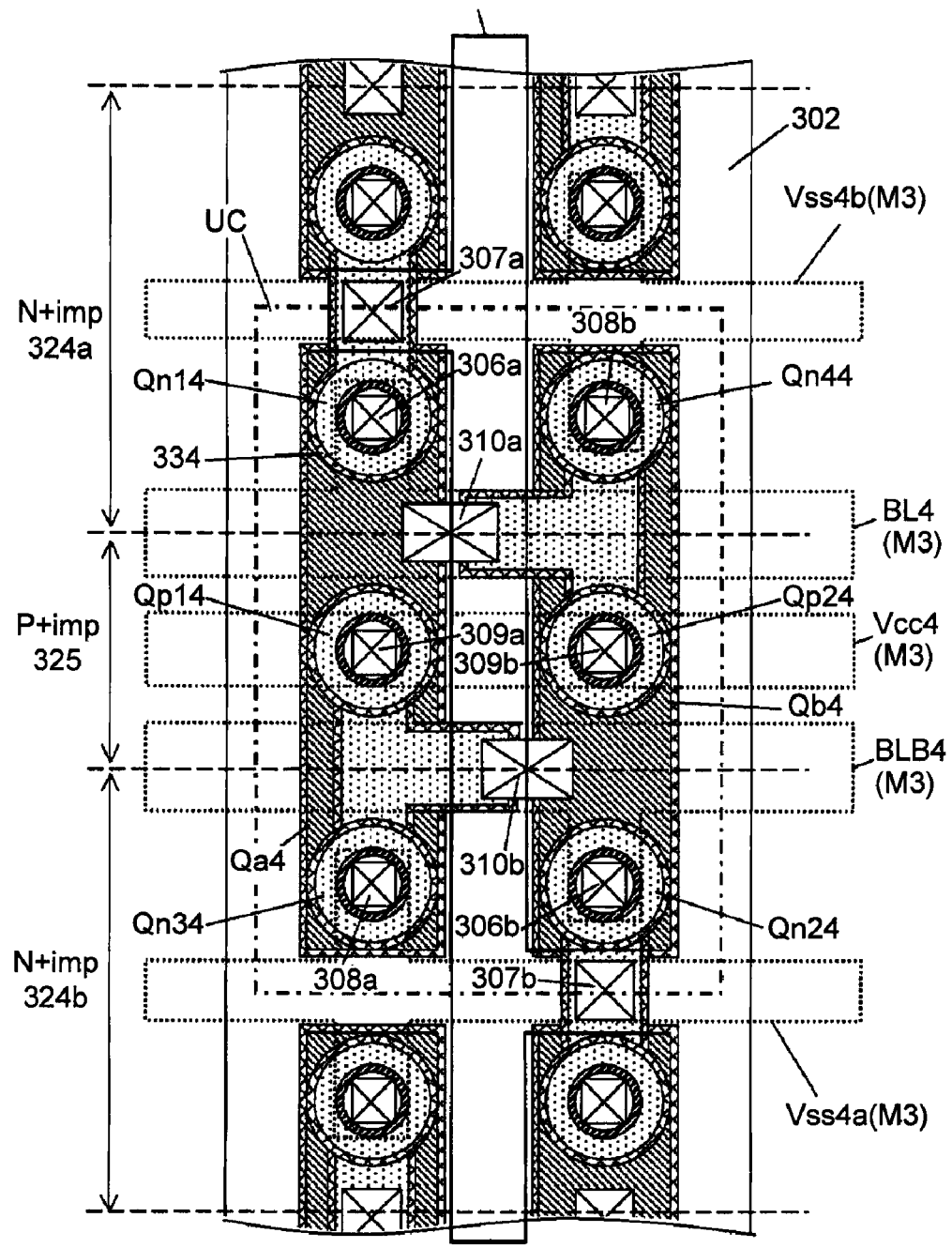
FIG. 19 is a planar view of the SRAM according to a fourth embodiment of the present application.

FIG. 19 shows an illustrative SRAM cell layout for this embodiment. This embodiment differs from embodiment 2 in that the gate wiring and the diffusion layers, which are the memory nodes, on the substrate are connected by common contacts formed over both the gate wiring and the diffusion layers in this embodiment. As shown in FIG. 19, the diffusion layers on the substrate that are the memory node Qa4 and the gate wiring extending from the gate electrodes of the driver transistor Qn44 and the load transistor Qp24 are connected through a common contact 310a formed over both the diffusion layers and the gate wiring. And, the diffusion layers in the surface region of the substrate that are the memory node Qb4 and the gate wiring extending from the gate electrodes of the driver transistor Qn34 and the load transistor Qp14 are connected through a common contact 310b formed over both the diffusion layers and the gate wiring. By not connecting the gates and the memory nodes with a wiring layer but instead connecting them with contacts as described above, it is possible to reduce the number of contacts in the SRAM cell. Therefore, it is possible to reduce the cell surface area by adjusting the positioning of the columnar silicon layers and contacts. In particular, it is possible to reduce the cell surface area by forming the contacts formed on the pillars and the above-described common contacts 310a, 310b with different lithography and etching processes. In this case, by positioning the common contact 310a near the center of the four contacts 306a, 308b, 309a, 309b on the pillars and positioning the common contact 310b near the center of the four contacts 306b, 308a, 309a, 309b on the pillars, it is possible to reduce the space between the contacts on the pillars and the common contacts less than the minimum space formable with the same procedures, and it is possible to reduce cell surface area.

As described in the first embodiment, the word line wiring, the bit line wiring, the power source potential wiring and the ground potential wiring are preferably positioned on the layer above the node connection wiring, which is the wiring within each memory cell, that is to say, they are positioned on a layer above the contact 310a and the contact 310b, so as to be shared with the wiring of other memory cells.

The arrangement other than this point is the same as that of embodiment 2, so the arrangement's description will be omitted.

Embodiment 5

Figure 20:
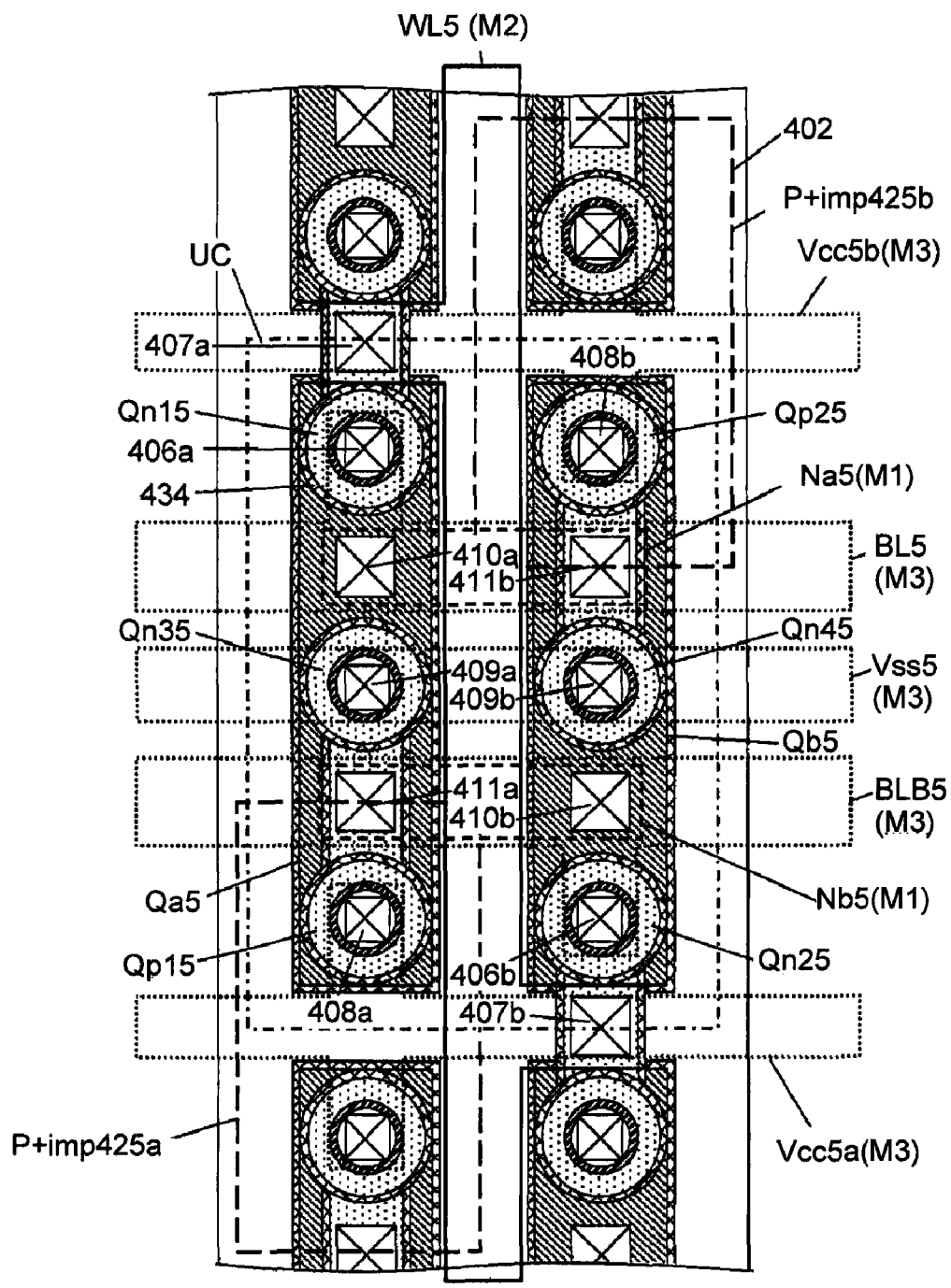
FIG. 20 is a planar view of the SRAM according to a fifth embodiment of the present application.

FIG. 20 shows an illustrative SRAM cell layout for this embodiment. This embodiment differs from Embodiment 2 in that the positioning of the driver transistor and the load transistor are switched. In this embodiment, because the positioning of the driver transistor and the load transistor are switched, there is only one boundary between the P+ doping regions 425a, 425b and the N+ doping region that traverse the diffusion layers on the substrate that are the memory node. Therefore, there is only one place near the boundary of the N+ doping region and the P+ doping regions where the overlapping margin must be secured, and it is possible to reduce the length of the SRAM cell in the vertical direction. However, as in the layout of Embodiment 1, the N+ doping region and the P+ doping regions are not simple line and space, as the P+ doping regions 425a, 425b are a rectangular grooved pattern, while the N+ doping region is a pattern that is the reverse of the P+ doping regions 425a, 425b. Thus, it is necessary to control resist patterns accurately in arranging the patterns of the doping regions.

In this embodiment, the positioning of the power source potential wiring Vcc5a, Vcc5b and the ground potential wiring Vss5 are switched from the case in Embodiment 2 accompanying the switching of the positions of the driver transistor and the load transistor.

As described in the first embodiment, the word line wiring, the bit line wiring, the power source potential wiring and the ground potential wiring are preferably positioned on the layer above the node connection wiring, which is the wiring within each memory cell, so as to be shared with the wiring of other memory cells. As one example of the arrangement of layered wiring on this point, the same arrangement as in above-described embodiment 2 can be attained.

The subsequent preferred arrangement is the same as that of embodiment 2, so the arrangement's description will be omitted.

Embodiment 6

Figure 21:
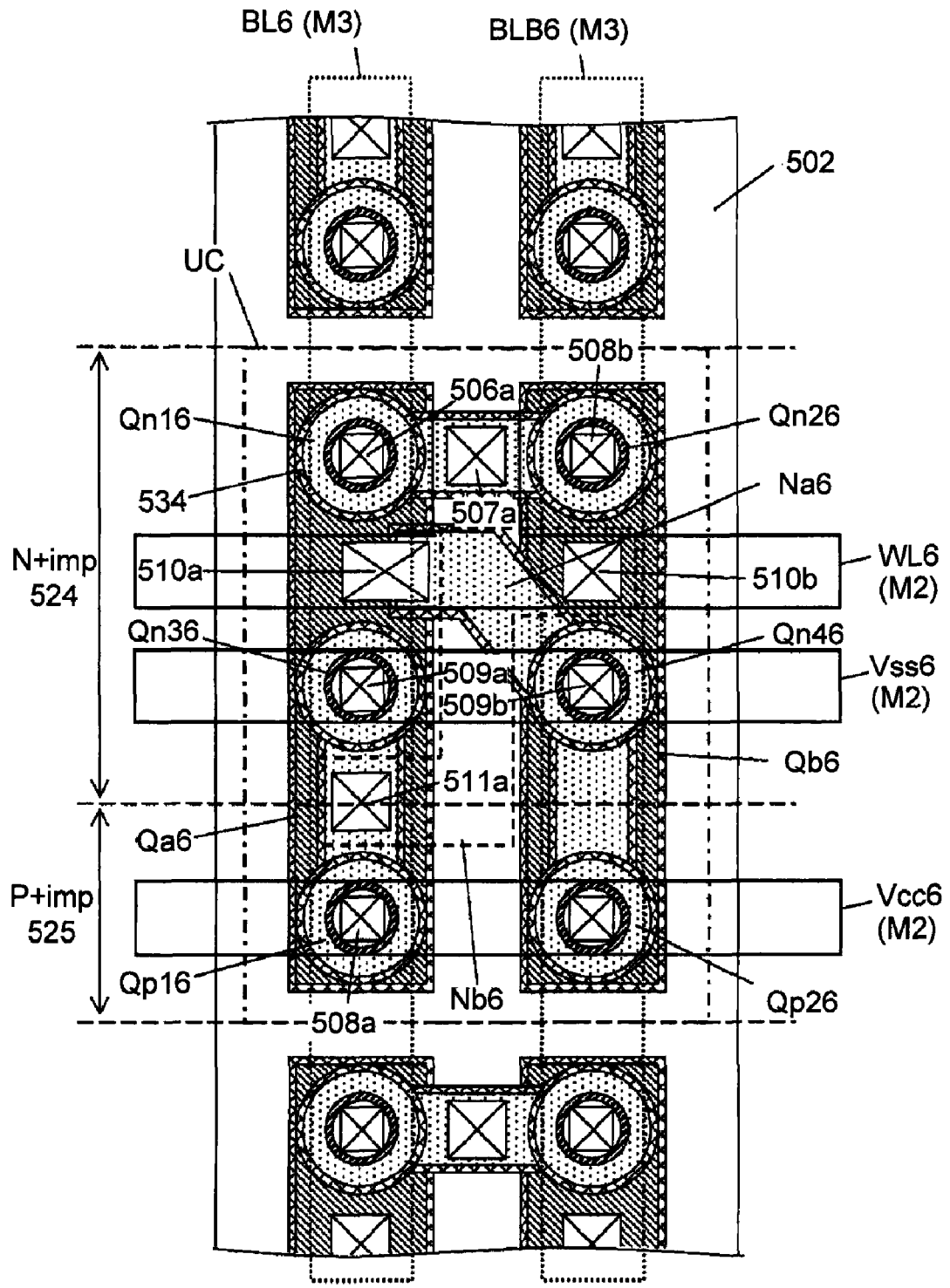
FIG. 21 is a planar view of the SRAM according to a sixth embodiment of the present application.

FIG. 21 shows an illustrative SRAM cell layout for this embodiment. The preferred arrangement of each transistor constructing the SRAM in this embodiment differs from the arrangement of Embodiment 2. In this embodiment, because the arrangement of the transistors is changed, there is only one boundary line between the P+ doping region 525 and the N+ doping region 524 that traverses the diffusion layers on the substrate that are the memory node. For that reason, there is only one place near the boundary of the N+ doping region and the P+ doping region where the overlapping margin must be secured, making it possible to reduce the length of the SRAM cell in the vertical direction. Furthermore, the N+ doping region 524 and the p+ doping region 525 are formed of simple line and space, the same as in Embodiment 1. For that reason, it is possible to minimize the dimension margin near the boundary of the N+ doping region and the P+ doping region, so it is possible to reduce the length of the SRAM cell in the vertical direction even shorter than in the case of Embodiment 5. In addition, the access transistors Qn16 and Qn26 are adjacent, so it is possible to share contacts formed on the gate electrodes of these access transistors.

As shown in FIG. 21, the first memory node Qa6 comprising the diffusion layers in the surface region of the substrate and the gate wiring extending from the gate electrodes of the driver transistor Qn46 and the load transistor Qp26 are connected through a common contact 510a. And, the contact 510b formed on the second memory node Qb6 comprising the diffusion layers on the substrate is connected to the contact 511a through the node connection wiring Nb6, which is the first layer wiring. In this manner, the preferred wiring method of the SRAM cell in this embodiment is asymmetrical left-to-right, so it is possible that SRAM properties could become asymmetrical left-to-right as well. When SRAM properties become asymmetrical left-to-right, the SRAM operating margin deteriorates, so in this embodiment, it is necessary to be careful about asymmetry in SRAM properties.

In this embodiment, the word line WL6 is wired in the horizontal direction and the bit lines BL6, BLB6 are wired in the vertical direction, unlike in the embodiments described above. In addition, because two driver transistors Qn36, Qn46 and two load transistors Qp16, Qp26 are formed in the same rows, it is possible to connect the driver transistors Qn36, Qn46 and the load transistors Qp16, Qp26 to the power source potential wiring Vcc6 and the ground potential wiring Vss6 with a simple layout.

As described in the first embodiment, the word line wiring, the bit line wiring, the power source potential wiring and the ground potential wiring are preferably positioned on the layer above the node connection wiring, which is the wiring within each memory cell, so as to be shared with the wiring of other memory cells. As one example of an arrangement of layered wiring on this point, it is possible to attain an arrangement in which the node connection wiring Na6, Nb6 is wired in the lower layer, the word line WL2, the power source potential wiring Vcc6 and the ground potential wiring Vss6 are wired in the middle layer, and the bit line wiring BL6, BLB6 is wired in the upper layer.

Embodiment 7

Figure 22:
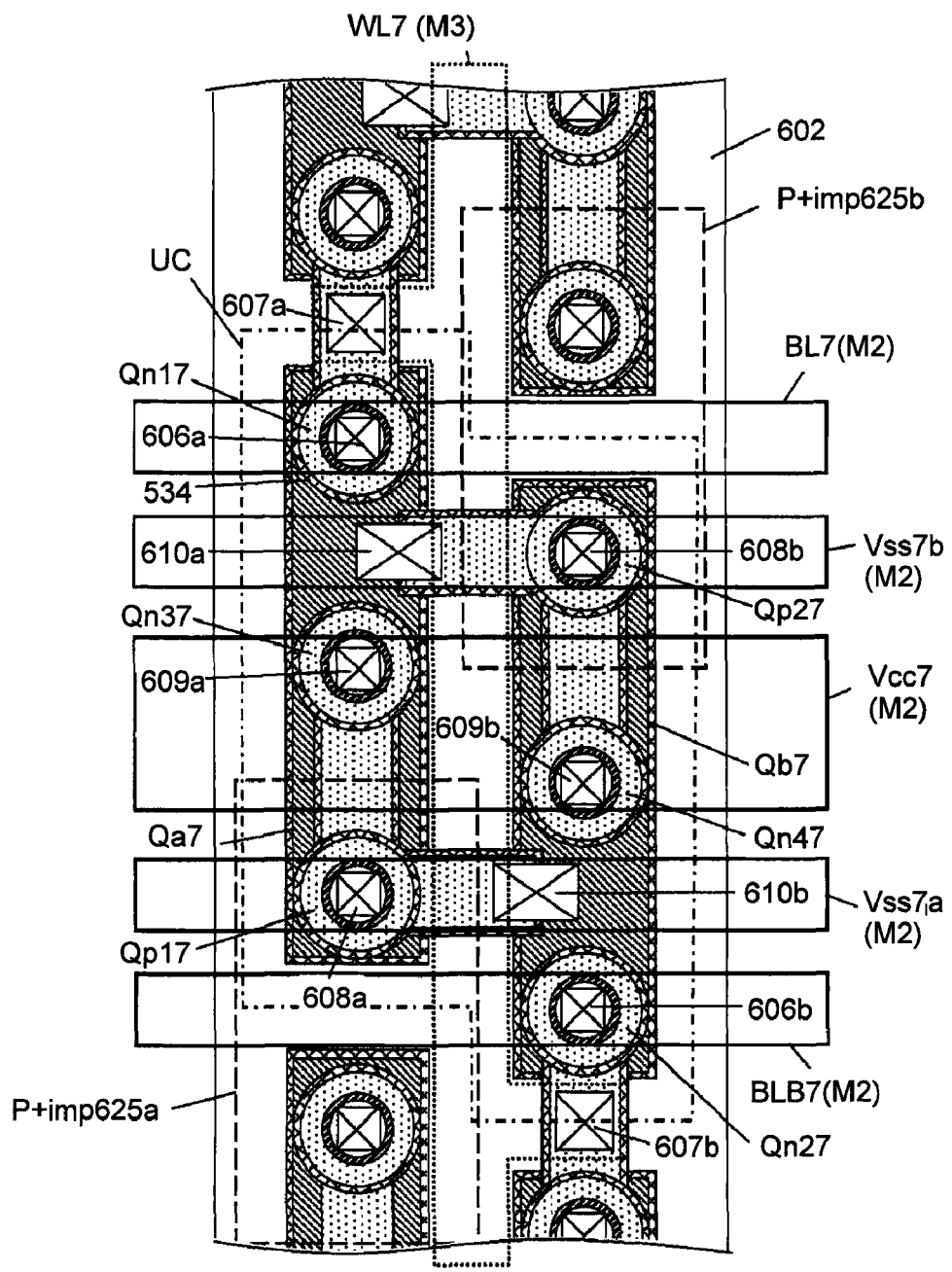
FIG. 22 is a planar view of the SRAM according to a seventh embodiment of the present application.

FIG. 22 shows an illustrative SRAM cell layout for this embodiment. This embodiment differs from the other embodiments in that the columnar semiconductors are arranged in a hexagonal lattice shape so as to be hexagonally close-packed. By positioning the columnar semiconductors in this manner, it is possible to position the columnar semiconductor with good balance in the smallest surface area, and to design a small SRAM cell surface area. The arrangement of the transistors is not limited to the arrangement in FIG. 22, as other arrangements may also be adopted.

As described in the first embodiment, the word line wiring, the bit line wiring, the power source potential wiring and the ground potential wiring are preferably positioned on the layer above the node connection wiring, which is the wiring within each memory cell, so as to be shared with the wiring of other memory cells. As one example of the arrangement of layered wiring on this point, the same arrangement described in embodiment 2 can be attained.

Embodiment 8

Figure 23:
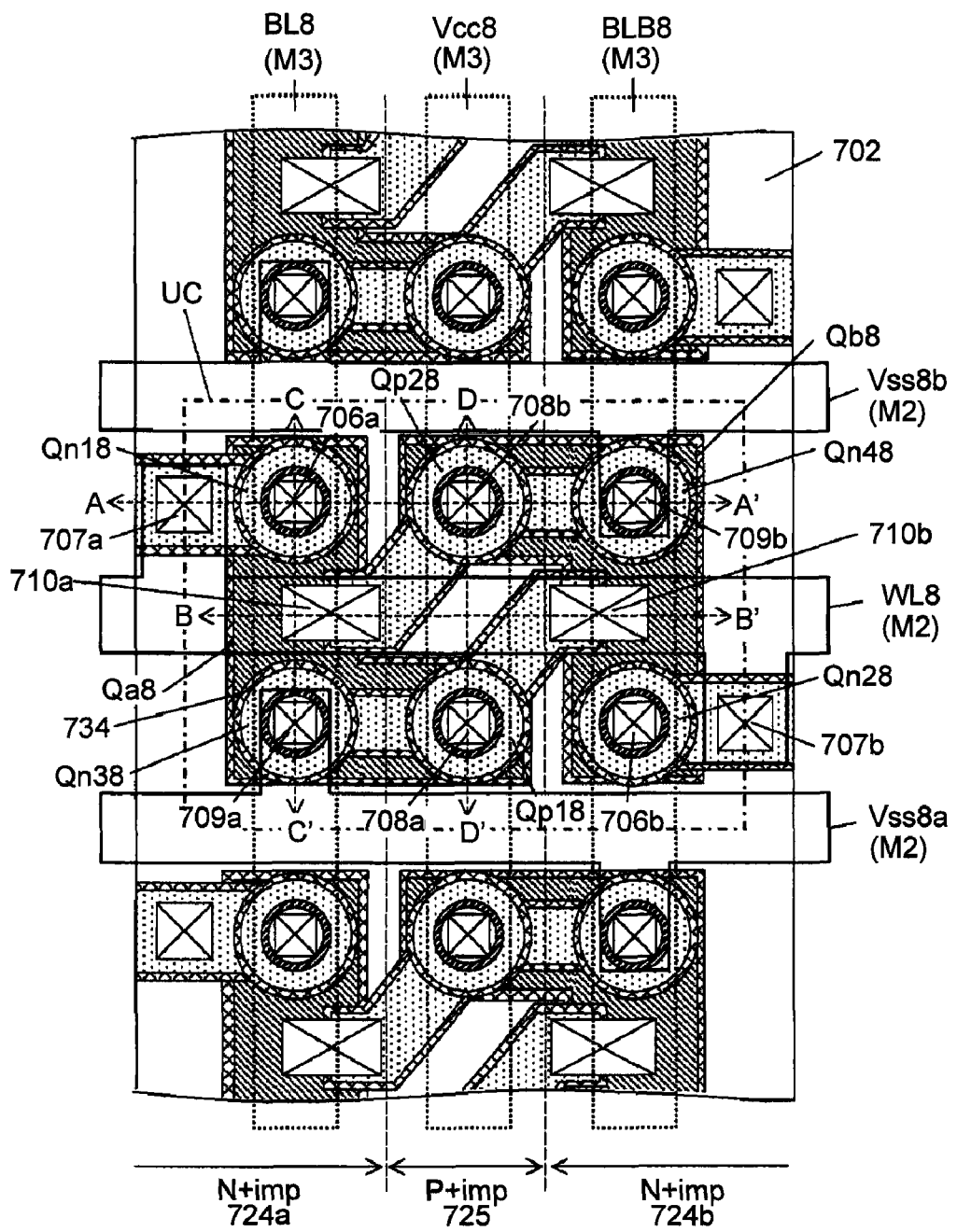
FIG. 23 is a planar view of the SRAM according to an eighth embodiment of the present application.
Figure 24A:
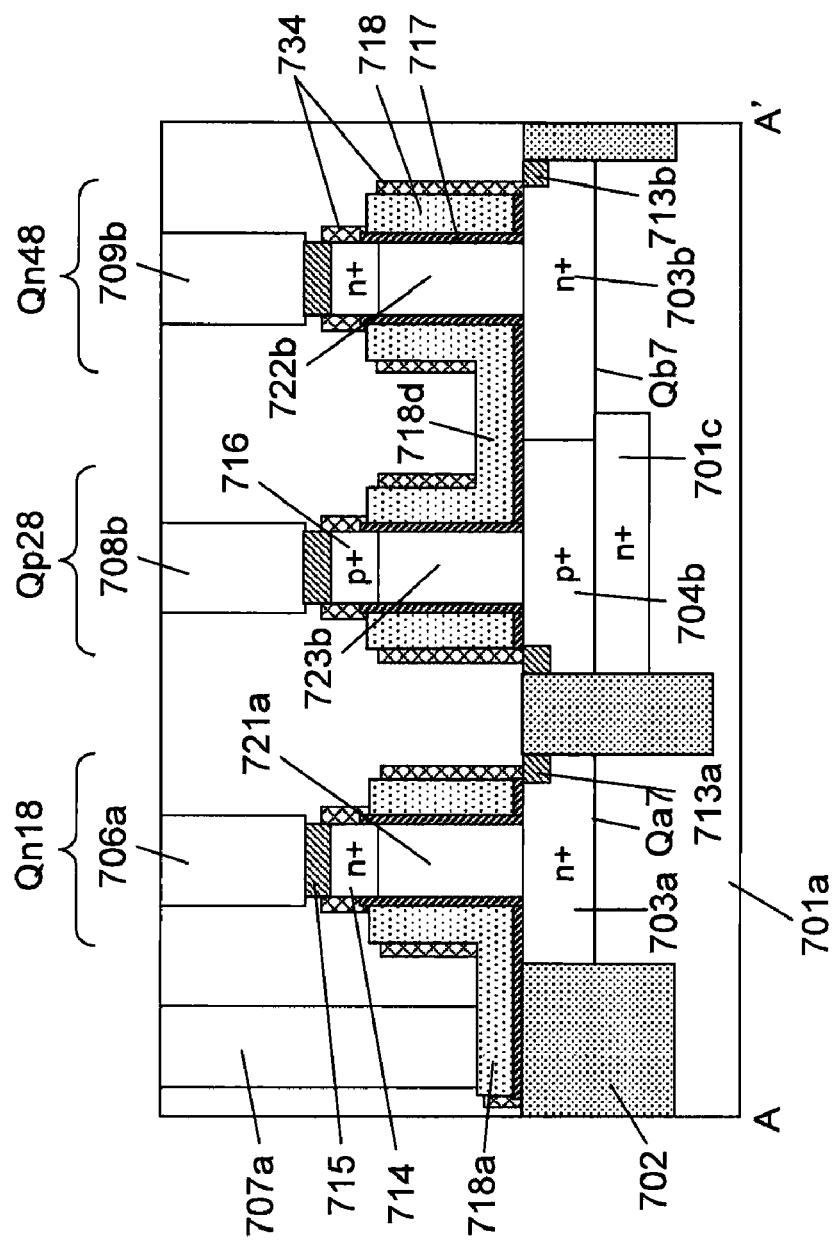
FIG. 24A is a cross-sectional view of the SRAM according to the eighth embodiment of the present application.

FIG. 23 shows the cell layout of Embodiment 8 of the present application. The unit cell shown in FIG. 23 is repeatedly arranged in the SRAM cell layout. FIGS. 24A, B, C and D show the cross-sectional structure taken along cut lines A-A', B-B', C-C' and D-D', respectively, in the layout diagram of FIG. 23.

First, the layout of the SRAM according to this embodiment will be described with reference to FIGS. 23 and 24A through 24D.

This embodiment differs from the other embodiments in that the layout of the lower diffusion layers on the substrate that are the memory nodes is L-shaped. In terms of arranging the patterns of the lower diffusion layers on the substrate, the diffusion layers are a rectangular shape as in the other embodiments. However, in this embodiment there is only one boundary line between the N+ doping regions 724a, 724b and the P+ doping region 725 that traverse the memory node, the same as in Embodiment 5 and Embodiment 6, and moreover the pattern that forms the N+ doping regions 724a, 724b and the P+ doping region 725 is formed of simple line and space. Consequently, it is possible to minimize the dimension margin near the boundary of the N+ doping regions 724a, 724b and the P+ doping region 725 to design an SRAM cell with small surface area.

In this embodiment, the word line WL8 is wired in the horizontal direction and the bit lines BL8, BLB8 are wired in the vertical direction. Contacts 707a, 707b to the gates of the access transistors connected from the bit lines BL8, BLB8 can be shared with memory cells, which are not represented in the drawings, adjacent to the unit cell UC shown in FIG. 23 in the horizontal direction. The gate wiring extending from the gate electrodes of the driver transistor Qn48 and the load transistor Qp28 and the lower diffusion layers of the memory node Qa8 on the substrate are connected via a common contact 710a formed over both the gate wiring and the diffusion layers. Furthermore, the gate wiring extending from the gate electrodes of the driver transistor Qn38 and the load transistor Qp18 and the diffusion layers of the memory node Qb8 on the substrate are connected via a common contact 710b formed over both the gate wiring and the diffusion layers.

As described in the first embodiment, the word line wiring, the bit line wiring, the power source potential wiring and the ground potential wiring are positioned in layers above the node connection wiring, which is the wiring within each memory cell, that is to say in layers above the contact 707a and the contact 707b, so as to be shared with the wiring of other memory cells. As one example of an arrangement of layered wiring on this point, it is possible to attain an arrangement where the node connection wiring is wired in the lower layer, the word line WL8 and the ground potential wiring Vss8a, Vss8b are wired in the middle layer, and the bit line wiring BL8, BLB8 and the power source potential wiring Vcc8 are wired in the upper layer.

Next, the structure of the SRAM according to this embodiment will be described with reference to the cross-sectional structure shown in FIG. 24A through 24D.

As shown in FIG. 24A, a P-well, which is a first well 701a, is formed in the surface region of the substrate and the lower diffusion layers on the substrate are separated by an isolation layer 702. An N+ drain diffusion layer 703a is formed through conventional doping methods or the like in a first memory node Qa7 comprising the lower diffusion layers on the substrate, and an N+ drain diffusion layer 703b and a P+ drain diffusion layer 704b are respectively formed through conventional doping methods or the like in a second memory node Qb7 comprising the lower diffusion layers on the substrate. In addition, the P+ lower diffusion layer 704b, which has the same conductive type as the first well 701a, is surrounded by an N-well that is a second anti-leak diffusion layer 701c having a conductive type differing from the first well 701a in order to control leakage to the substrate.

Silicide layers 713a, 713b are formed in the surface region of the drain diffusion layers 703a, 703b, 704b, and the N+ lower diffusion layer 703b and the P+ lower diffusion layer 704b are connected through the silicide layer 713b which is not shown in the drawings. A columnar silicon layer 721a constructing an access transistor Qn18 is formed on the N+ drain diffusion layer 703a. A columnar silicon layer 723b constructing a load transistor Qp28 is formed on the P+ drain diffusion layer 704b, And, a columnar silicon layer 722b constructing a driver transistor Qn48 is formed on the N+ drain diffusion layer 703b. Gate insulating film 717 and gate electrode 718 are formed surrounding each of these columnar silicon layers. Source diffusion layers 714, 716 are formed through conventional doping methods or the like on the surface of the columnar silicon layers, and a silicide layer 715 is formed on the surface of the source diffusion layer. A contact 706a formed on the access transistor Qn18 is connected to the bit line BL8, a contact 707a formed on the gate wiring 718a extending from the gate electrode of the access transistor Qn18 is connected to the word line WL8, a contact 708b formed on the load transistor Qp28 is connected to the power source potential wiring Vcc8, a contact 709b formed on the driver transistor Qn48 is connected to the ground potential wiring Vss8, and the gate electrodes of the load transistor Qp28 and the driver transistor Qn48 are connected to each other via the gate wiring 718 extending from each of the gate electrodes.

Figure 24B:
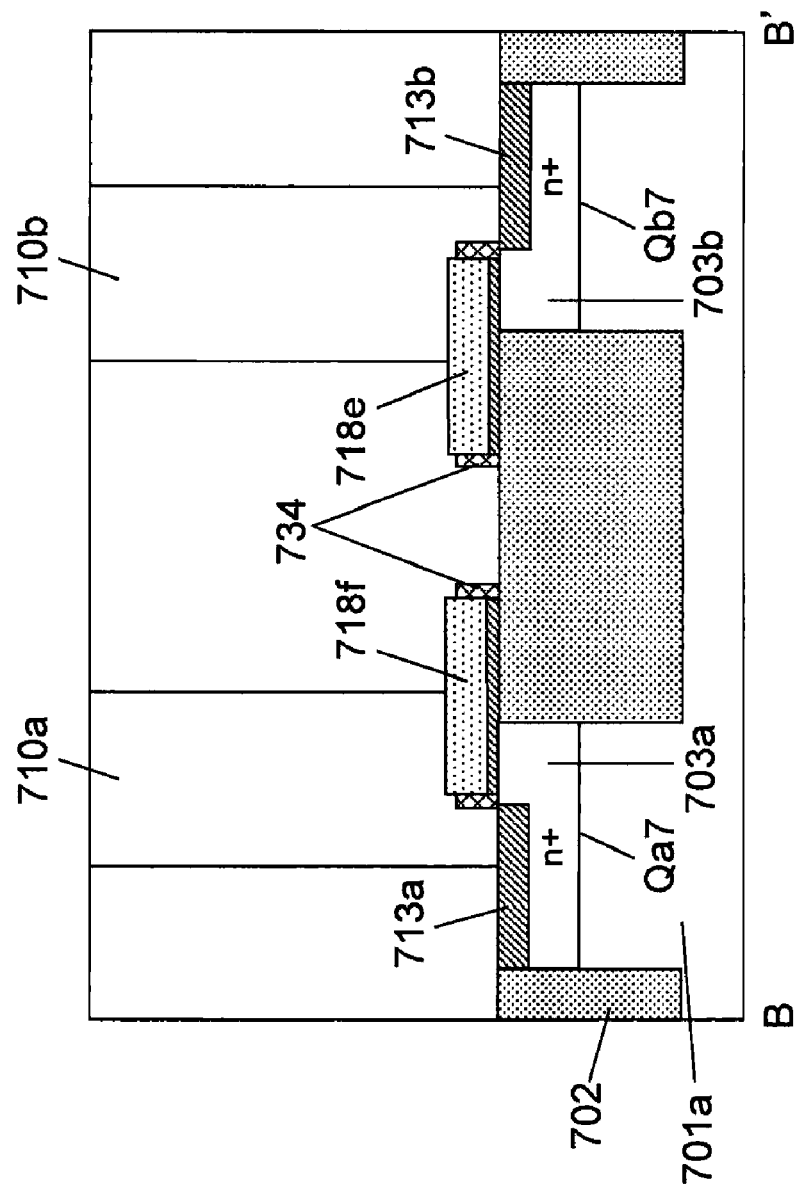
FIG. 24B is a cross-sectional view of the SRAM according to the eighth embodiment of the present application.

As shown in FIG. 24B, the P-well, which is the first well 701a, is formed in the surface region of the substrate and the lower diffusion layers on the substrate are separated by the isolation layer 702. The N+ drain diffusion layer 703a is formed through conventional doping methods or the like in the first memory node Qa7 comprising the lower diffusion layers on the substrate, the N+ drain diffusion layer 703b is formed through conventional doping methods or the like in the second memory node Qb7 comprising the lower diffusion layers on the substrate, and the silicide layers 713a, 713b are formed in the surface region of the N+ drain diffusion layers. The drain diffusion layer 703a and the gate wiring 718f are connected through a common contact 710a formed over both the drain diffusion layer 703a and the gate wiring 718f. And, the drain diffusion layer 703b and the gate wiring 718e are connected through a common contact 710b formed over both the drain diffusion layer 703b and the gate wiring 718e.

Figure 24C:
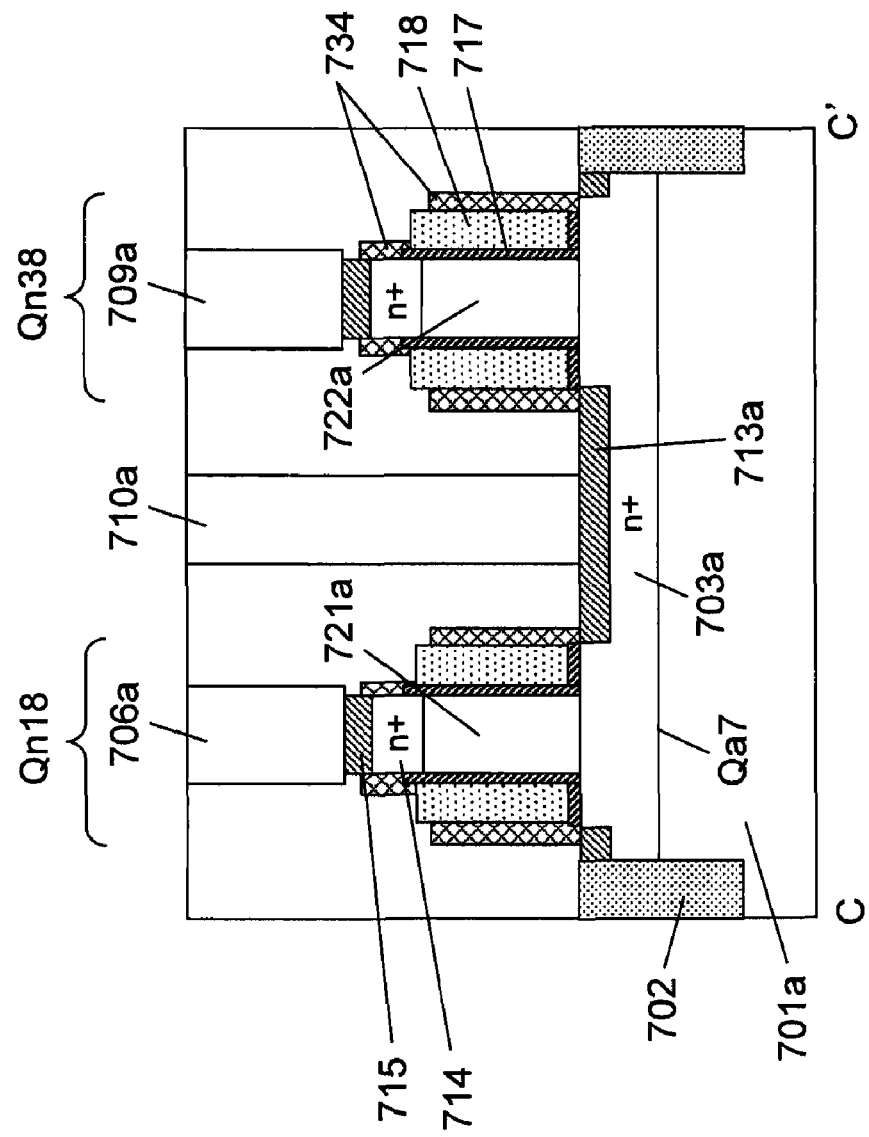
FIG. 24C is a cross-sectional view of the SRAM according to the eighth embodiment of the present application.

As shown in FIG. 24C, the P-well, which is the first well 701a, is formed in the surface region of the substrate and the lower diffusion layers on the substrate are separated by the isolation layer 702. The N+ drain diffusion layer 703a is formed through conventional doping methods or the like on the first memory node Qa7 comprising the lower diffusion layers on t the substrate, and a silicide layer 713a is formed on the surface of the N+ drain diffusion layer 703a. The columnar silicon layer 721a constructing the access transistor Qn18 and the columnar silicon layer 722a constructing the driver transistor Qn38 are formed on the N+ drain diffusion layer 703a. Gate insulating film 717 and gate electrodes 718 are formed surrounding each of these columnar silicon layers. The source diffusion layer 714 is formed through conventional doping methods or the like on top of the columnar silicon layer, and a silicide layer 715 is formed on the surface of the source diffusion layer. A contact 706a formed on the access transistor Qn18 is connected to the bit line BL8 and a contact 709a formed on the driver transistor Qn38 is connected to the ground potential wiring Vss8.

Figure 24D:
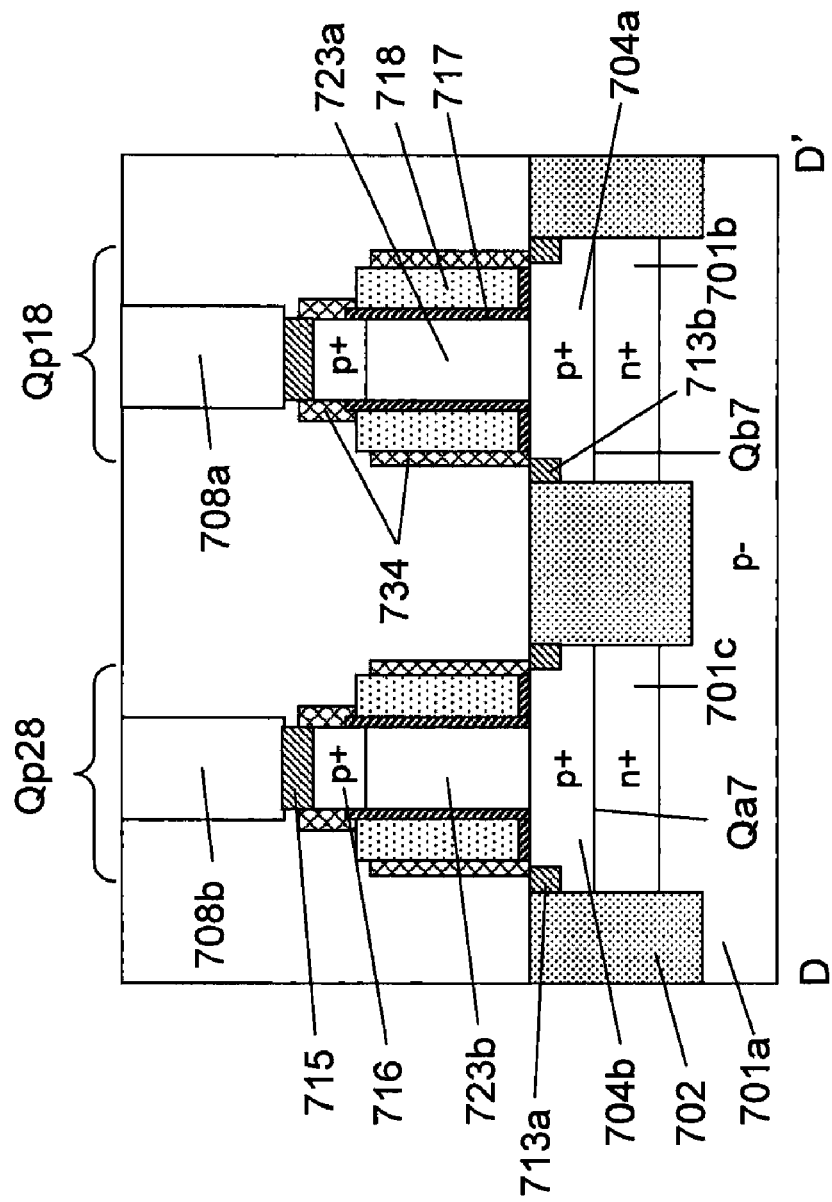
FIG. 24D is a cross-sectional view of the SRAM according to the eighth embodiment of the present application.
Figure 25A:
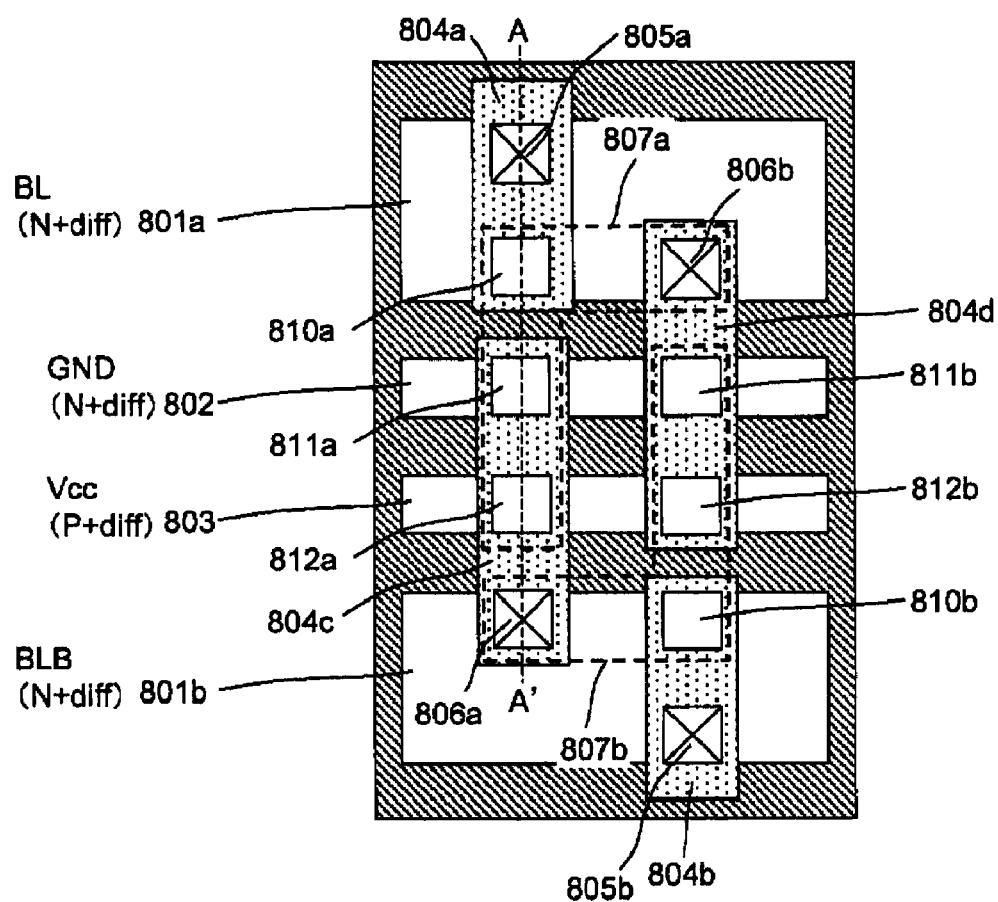
FIG. 25A shows a planar view of a conventional SRAM.
Figure 25B:
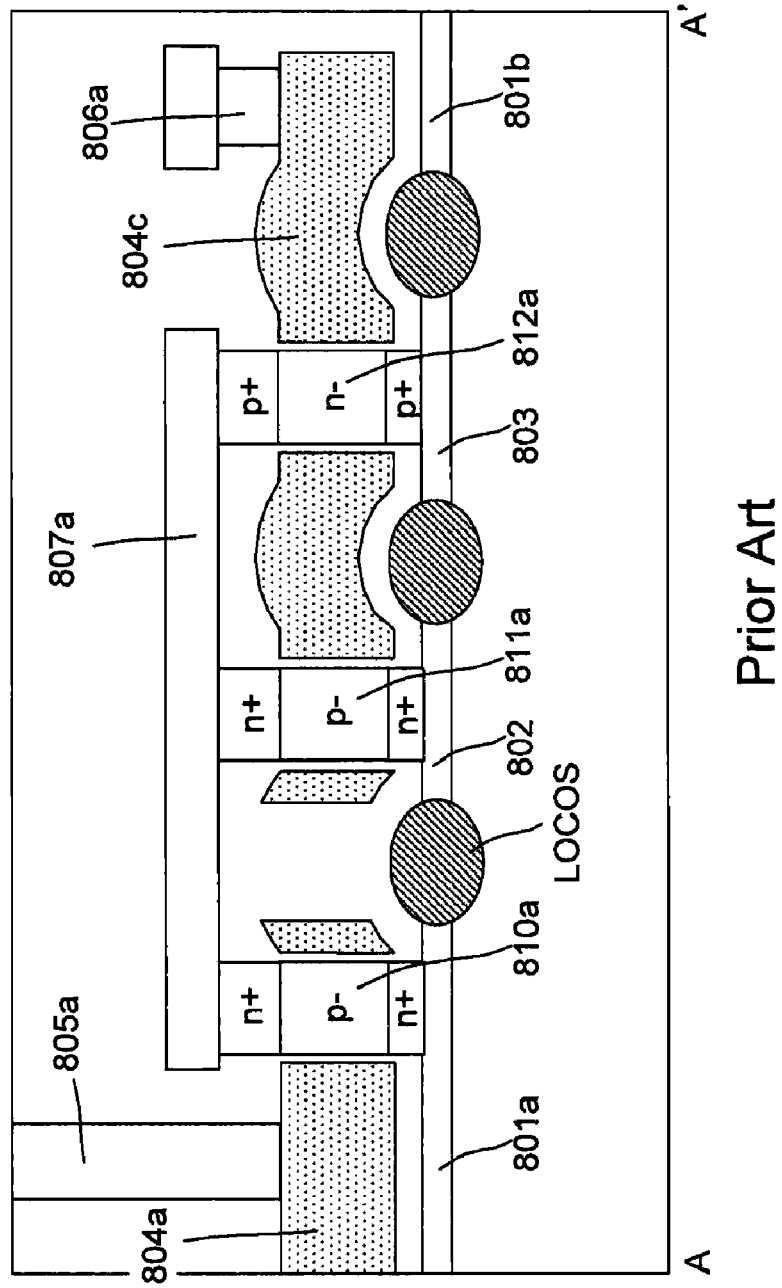
FIG. 25B shows a cross-sectional view of a conventional SRAM.

As shown in FIG. 24D, the P-well, which is a first well 701a, is formed in the surface region of the substrate and the lower diffusion layers on the substrate are separated by the isolation layer 702. The P+ drain diffusion layer 704a is formed through conventional doping methods or the like in the first memory node Qa7 comprising the lower diffusion layers on the substrate, and the P+ drain diffusion layer 704b is formed through conventional doping methods or the like in the second memory node Qb7 comprising the diffusion layers on the substrate. In addition, a first anti-leak N+ diffusion layer 701b having a conductive type differing from the first well 701a is formed at the bottom of the P+ drain diffusion layer 704a, which has the same conductive type as the first well 701a, in order to control leakage to the substrate, and a first anti-leak N+ diffusion layer 701c having a conductive type differing from the first well 701a is formed at the bottom of the P+ drain diffusion layer 704b, which has the same conductive type as the first well 701a, in order to control leakage to the substrate. The columnar silicon layer 723b constructing the load transistor Qp28 is formed on the drain diffusion layer 704b, and the columnar silicon layer 723a constructing the load transistor Qp18 is formed on the drain diffusion layer 704a. Gate insulating film 717 and gate electrodes 718 are formed surrounding each of these columnar silicon layers, the P+ source diffusion layer 716 is formed through conventional doping methods or the like on the surface of these columnar silicon layers, and a silicide layer 715 is formed on the surface of the source diffusion layer. The contacts 708b, 708a formed on the load transistor Qp28 and the load transistor Qp18 are connected to the power source potential wiring Vcc8.

In this embodiment, the N+ drain diffusion layer and the P+ drain diffusion layer formed in the memory nodes on the substrate are directly connected through the silicide layer formed on the surface of the respective diffusion layer, which is similar to the embodiments described above. This allows the drain diffusion layers that are common among the access transistor, the driver transistor, and the load transistor to serve as SRAM memory nodes. Consequently, an isolation layer for separating the N+ source drain diffusion layer and the P+ source drain diffusion layer, which is necessary in conventional planar transistors, is not needed. Because it is sufficient only to separate the two memory nodes of the SRAM with the isolation layer, it is possible to attain an extremely small SRAM cell surface area.

As described above, according to the present application, the static memory cells comprising six MOS transistors serve as SRAM memory nodes by the MOS transistors being formed of SGTs in which the drain, the gate and the source are positioned in the vertical direction. The first well is formed in the surface region of the substrate. The N+ source diffusion layer and the P+ source diffusion layer formed on the substrate are directly connected by a silicide layer formed on their surface, and the various drain diffusion layers of the same conductive type as the first well are surrounded by the first and second anti-leak diffusion layers shallower than the first well and having a conductive type opposite the first well. Consequently, it is possible to attain a CMOS-type 6T-SRAM having an extremely small memory cell surface area because the isolation layer for separating the N+ source drain diffusion layer and the P+ source drain diffusion layer that are necessary in a conventional planer transistor is not needed. An isolation layer for separating the two memory nodes of the SRAM is sufficient.

The present application is not limited to the foregoing embodiment, and various modifications and applications thereof can be made.

EXPLANATION OF REFERENCE NUMERALS

Qa, Qa2, Qa3, Qa4, Qa5, Qa6, Qa7: first memory node
Qb, Qb2, Qb3, Qb4, Qb5, Qb6, Qb7: second memory node
1a, 101a, 201a, 301a, 401a, 501a, 601a, 701a: first well
1b, 701b: first anti-leak diffusion layer
1c, 701c: second anti-leak diffusion layer
2, 102, 202, 302, 402, 502, 602, 702: isolation layer
3a, 103a, 203a, 303a, 403a, 503a, 603a, 703a, 3b, 103b, 203b, 303b, 403b, 503b, 603b, 703b: N+ drain diffusion layer (first N+ lower diffusion layer)
4a, 104a, 204a, 304a, 404a, 504a, 604a, 704a, 4b, 104b, 204b, 304b, 404b, 504b, 604b, 704b: P+ drain diffusion layer (third P+ lower diffusion layer)
5a, 105a, 205a, 305a, 405a, 505a, 605a, 5b, 105b, 205b, 305b, 405b, 505b, 605b: N+ drain diffusion layer (second N+ lower diffusion layer)
6a, 106a, 206a, 306a, 406a, 506a, 606a, 706a, 6b, 106b, 206b, 306b, 406b, 506b, 606b, 706b: contact on access transistor source diffusion layer
7a, 107a, 207a, 307a, 407a, 507a, 607a, 707a, 7b, 107b, 207b, 307b, 407b, 507b, 607b, 707b: contact on access transistor word line
8a, 108a, 208a, 308a, 408a, 508a, 608a, 708a, 8b, 108b, 208b, 308b, 408b, 508b, 608b, 708b: contact on load transistor source diffusion layer 9a, 109a, 209a, 309a, 409a, 509a, 609a, 709a, 9b, 109b, 209b, 309b, 409b, 509b, 609b, 709b: contact on driver transistor source diffusion layer 10a, 110a, 210a, 310a, 410a, 510a, 610a, 710a, 10b, 110b, 210b, 310b, 410b, 510b, 610b, 710b: contact on drain diffusion layer 11a, 111a, 211a, 311a, 411a, 511a, 611a, 711a, 11b, 111b, 211b, 311b, 411b, 511b, 611b, 711b: contact on gate wiring 13a, 13b, 15, 713a, 713b, 715: silicide layer 14, 714: N+ source diffusion layer (fourth or fifth N+ upper diffusion layer)

16, 716: P+ source diffusion layer (sixth P+ upper diffusion layer)

17, 717: gate insulating film 18, 718: gate electrode 18a, 18b, 18c, 18d, 718a, 718d, 718e, 18f: gate wiring 21a, 21b, 721a, 721b: access transistor columnar silicon layer 22a, 22b, 722a, 722b: driver transistor columnar silicon layer 23a, 23b, 723a, 723b: load transistor columnar silicon layer 24a, 124a, 224a, 324a, 524, 724a, 24b, 124b, 224b, 324b, 724b: N+ doping region 25, 125, 225, 325, 425a, 425b, 525, 625a, 625b, 725: P+ doping region 33: resist 34: insulating film of silicon nitride film.

Qa, Qb: memory node

Qn11, Qn21, Qn12, Qn22, Qn13, Qn23, Qn14, Qn24, Qn15, Qn25, Qn16, Qn26, Qn17, Qn27, Qn18, Qn28: access transistor Qn31, Qn41, Qn32, Qn42, Qn33, Qn43, Qn34, Qn44, Qn35, Qn45, Qn36, Qn46, Qn37, Qn47, Qn38, Qn48: driver transistor Qp11, Qp21, Qp12, Qp22, Qp13, Qp23, Qp14, Qp24, Qp15, Qp25, Qp16, Qp26, Qp17, Qp27, Qp18, Qp28: load transistor BL1, BL2, BL3, BL4, BL5, BL6, BL7, BL8, BLB1, BLB2, BLB3, BLB4, BLB5, BLB6, BLB7, BLB8: bit line WL1, WL2, WL3, WL4, WL5, WL6, WL7, WL8: word line Vcc1, Vcc2, Vcc3, Vcc4, Vcc5a, Vcc5b, Vcc6, Vcc7, Vcc8: power source potential wiring Vss1a, Vss1b, Vss2a, Vss2b, Vss3a, Vss3b, Vss4a, Vss4b, Vss5, Vss6, Vss7a, Vss7b, Vss8a, Vss8b: ground potential wiring

What is claimed is:

1. A semiconductor memory device comprising multiple static memory cells, each of the multiple static memory cells including six MOS transistors arranged on a substrate, wherein the six MOS transistors serve as first and second NMOS access transistors for accessing the memory, first and second NMOS driver transistors for driving a memory node in order to retain data in the memory cells, and first and second PMOS load transistors for supplying electric charge in order to retain data in the memory cells, respectively;

each of the first and second NMOS access transistors comprise a first diffusion layer, a first columnar semiconductor layer and a second diffusion layer of each of the first and second NMOS access transistors for accessing the memory are arranged on the substrate in layers in a vertical direction, the first columnar semiconductor layer being arranged between the first diffusion layer and the second diffusion layer, and an access transistor gate resides on a side wall of the columnar semiconductor layer;

each of the first and second NMOS drive transistors comprise a third diffusion layer, a second columnar semiconductor layer, and a fourth diffusion layer of each of the first and second NMOS driver transistors for driving a memory node in order to retain data in the memory cells are arranged on the substrate in layers in the vertical direction, the columnar semiconductor layer being arranged between the third diffusion layer and the fourth diffusion layer, and a drive transistor gate resides on a side wall of the columnar semiconductor layer;

each of the first and second PMOS load transistors comprise a fifth diffusion layer, a third columnar semiconductor layer, and a sixth diffusion layer of each of the first and arranged on the substrate in layers in the vertical direction, where the third columnar semiconductor layer is between the fifth diffusion layer and the sixth diffusion layer, and a load transistor gate resides on a side wall of the columnar semiconductor layer;

the first NMOS access transistor, the first NMOS driver transistor, and the first PMOS load transistor are arranged mutually adjacent;

the second NMOS access transistor, the second NMOS driver transistor, and the second PMOS load transistor are arranged mutually adjacent;

a first well in the substrate, the first well shared by the multiple memory cells for giving a potential to the substrate;

wherein the first diffusion layer of the first NMOS access transistor resides at a bottom of the first NMOS access transistor and has an N-type conductivity, the third diffusion layer of the first NMOS driver transistor resides at a bottom of the first NMOS driver transistor and has an N-type conductivity, and the fifth diffusion layer of the first PMOS load transistor resides at a bottom of the first PMOS load transistor are mutually connected via a first silicide layer and form a first memory node for retaining data stored in the memory cells;

first anti-leak diffusion layer layers having a conductive type different from the first well between the first well and first selected diffusion layers having the same conductive type as the first well among the first diffusion layer of the first NMOS access transistor, the third diffusion layer of the first NMOS driver transistor, and the fifth diffusion layers layer of the first PMOS load transistor and serving as the first memory node in order to prevent leaking between the first well and the first selected diffusion layer layers the first anti-leak diffusion is layers are directly connected to second selected diffusion layers having the same conductive type as the first anti-leak diffusion layers among the first diffusion layer of the first NMOS access transistor, third diffusion layer of the first NMOS driver transistor, and fifth diffusion layer of the first PMOS load transistor serving as the first memory node;

wherein the first diffusion layer of the second NMOS access transistor resides at a bottom of the second NMOS access transistor and has an N-type conductivity, the third diffusion layer of the second NMOS driver transistor resides at a bottom of the second NMOS driver transistor and has an N type conductivity, and the fifth diffusion layer of the second PMOS load transistor resides at a bottom of the second PMOS load transistor and has a P-type conductivity and are mutually connected via a second silicide layer and form a second memory node for retaining data stored in the memory cells; and second anti-leak diffusion layers having a conductive type different from the first well and is formed between the first well and third selected diffusion layers having the same conductive type as the first well among the first diffusion layer of the second NMOS access transistor, the third diffusion layer of the second NMOS driver transistor, and the fifth diffusion layer of the second PMOS load transistor serving as the second memory node in order to prevent leaking between the first well and the third selected diffusion layers the second anti-leak diffusion layer are directly connected to fourth selected diffusion layers having the same conductive type as the second anti-leak diffusion layers among the first diffusion layer of the second NMOS access transistor, the third diffusion layer of the second NMOS driver transistor, and the fifth diffusion layer of the second PMOS load transistor serving as the second memory node.

2. The semiconductor memory device according to claim 1, wherein a first gate wiring extending from the gate of each of the first NMOS driver transistor and the first PMOS load transistor on the diffusion layers serving as the first memory node is connected by a first common contact, and a second gate wiring extending from the gate of each of the second NMOS driver transistor and the second PMOS load transistor formed on the diffusion layers serving as the second memory node is connected by a second common contact.

3. The semiconductor memory device according to claim 1, wherein a circumference of the side wall of each of the columnar semiconductor layers of the first and second NMOS driver transistors is longer than a circumference of the side wall of each of the columnar semiconductor layers of the first and second PMOS load transistors.

4. The semiconductor memory device according to claim 1, wherein the columnar silicon layers of the first and second NMOS driver transistors have an elliptical shape, such that a circumference of the side wall of each of the columnar semiconductor layers of the first and second NMOS driver transistors is longer than a circumference of the side wall of each of the columnar semiconductor layers of the first and second PMOS load transistors.

5. The semiconductor memory device according to claim 1, wherein at least one of contacts formed on third and fourth gate wirings extending from the gates of the first and second NMOS access transistors, respectively, is shared with a contact formed on a gate wiring extending from the gate of the NMOS access transistor of an adjacent memory cell.

6. The semiconductor memory device according to claim 1, wherein the columnar semiconductor layers are arranged in a hexagonal lattice shape.

7. The semiconductor memory device according to claim 1, wherein a fifth gate wiring extending from the gate of each of the first NMOS driver transistor and the first PMOS load transistor formed on the diffusion layers serving as the first memory node is connected by a third common contact with the diffusion layers serving as the second memory node; and a sixth gate wiring extending from the gate of each of the second NMOS driver transistor and the second PMOS load transistor formed on the diffusion layers serving as the second memory node is connected by a fourth common contact with the diffusion layers serving as the first memory node.

8. The semiconductor memory device according to claim 1, wherein the six MOS transistors are arranged in a matrix shape in a mutually intersecting row direction and column direction on the substrate, the six MOS transistors are arranged on the substrate in three rows and two columns;
the first NMOS access transistor is arranged in row 1, column 1;
the first PMOS load transistor is arranged in row 2, column 1;
the first NMOS driver transistor is arranged in row 3, column 1;
the second NMOS access transistor is arranged in row 3, column 2;
the second PMOS load transistor is arranged in row 2, column 2; and
the second NMOS driver transistor is arranged in row 1, column 2.

9. The semiconductor memory device according to claim 1, wherein the six MOS transistors are arranged in a matrix shape in a mutually intersecting row direction and column direction on the substrate, the six MOS transistors are arranged on the substrate in three rows and two columns;
the first NMOS access transistor is arranged in row 1, column 1;
the first PMOS load transistor is arranged in row 3, column 1;
the first NMOS driver transistor is arranged in row 2, column 1;
the second NMOS access transistor is arranged in row 3, column 2;
the second PMOS load transistor is arranged in row 1, column 2; and
the second NMOS driver transistor is arranged in row 2, column 2.

10. The semiconductor memory device according to claim 1, wherein the six MOS transistors are arranged in a matrix shape in a mutually intersecting row direction and column direction on the substrate, the six MOS transistors are arranged on the substrate in three rows and two columns;
the first NMOS access transistor is arranged in row 1, column 1;
the first PMOS load transistor is arranged in row 3, column 1;
the first NMOS driver transistor is arranged in row 2, column 1;
the second NMOS access transistor is arranged in row 1, column 2;
the second PMOS load transistor is arranged in row 3, column 2; and
the second NMOS driver transistor is arranged in row 2, column 2.

11. The semiconductor memory device according to claim 10, wherein a fifth contact formed on a seventh gate wiring extending from the gate of each of the first and second NMOS access transistors is shared with each other.

12. The semiconductor memory device according to claim 1, wherein the six MOS transistors are arranged in a matrix shape in a mutually intersecting row direction and column direction on the substrate, the six MOS transistors are arranged on the substrate in two rows and three columns;
the first NMOS access transistor is arranged in row 1, column 1;
the first PMOS load transistor is arranged in row 2, column 2;
the first NMOS driver transistor is arranged in row 2, column 1;
the second NMOS access transistor is arranged in row 2, column 3;
the second PMOS load transistor is arranged in row 1, column 2; and the second NMOS driver transistor is arranged in row 1, column 3.

13. A method of producing the semiconductor memory device according to claim 1, wherein a contact is formed on the columnar semiconductor and other contacts are formed through different etching processes.

14. The semiconductor memory device according to claim 1, wherein the first anti-leak diffusion layers having a conductive type different from the first well are formed between the fifth diffusion layer and the first well in order to prevent leaking between the fifth diffusion layer and the first well;

the first anti-leak diffusion layers are directly connected to the first diffusion layer and the third diffusion layer;

the second anti-leak diffusion layers having a conductive type different from the first well are formed between the fifth diffusion layer and the first well in order to prevent leaking between the fifth diffusion layer and the first well; and the second anti-leak diffusion layers are directly connected to the first diffusion layer and the third diffusion layer.

15. The semiconductor memory device according to claim 1, wherein the first anti-leak diffusion layers having a conductive type different from the first well are formed between the first diffusion layer and the first well and between the third diffusion layer and the first well in order to prevent leaking between the first diffusion layer and the first well and between the third diffusion layer and the first well;

the first anti-leak diffusion layers are directly connected to the fifth diffusion layer;

the second anti-leak diffusion layers having a conductive type different from the first well are formed between the first diffusion layer and the first well and between the third diffusion layer and the first well in order to prevent leaking between the first diffusion layer and the first well and between the third diffusion layer and the first well; and the second anti-leak diffusion layers are directly connected to the fifth diffusion layer.

16. The semiconductor memory device according to claim 1, wherein a circumference of the side wall of each of the columnar semiconductor layers of the first and second NMOS driver transistors is longer than a circumference of the side wall of each of the columnar semiconductor layers of the first and second NMOS access transistors.

17. The semiconductor memory device according to claim 1, wherein by forming the columnar silicon layers of the first and second NMOS driver transistors in an elliptical shape, a circumference of the side wall of each of the columnar semiconductor layers of the first and second NMOS driver transistors is longer than a circumference of the side wall of each of the columnar semiconductor layers of the first and second NMOS access transistors.

18. The semiconductor memory device according to claim 1, wherein a circumference of the side wall of each of the columnar semiconductor layers of the first and second PMOS load transistors is shorter than a circumference of the side wall of each of the columnar semiconductor layers of the first and second NMOS access transistors.

* * * * *